(12) United States Patent
Rajan et al.

(10) Patent No.: US 8,446,781 B1
(45) Date of Patent: May 21, 2013

(54) MULTI-RANK PARTIAL WIDTH MEMORY MODULES

(75) Inventors: Suresh Natarajan Rajan, San Jose, CA (US); Michael John Sebastian Smith, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/411,489

(22) Filed: Mar. 2, 2012

Related U.S. Application Data

(63) Continuation of application No. 11/939,432, filed on Nov. 13, 2007, now Pat. No. 8,130,560.

(60) Provisional application No. 60/865,623, filed on Nov. 13, 2006.

(51) Int. Cl.
*G11C 7/00* (2006.01)

(52) U.S. Cl.
USPC ............... 365/189.03; 365/63; 365/189.18; 365/230.03

(58) Field of Classification Search
USPC ................................................. 365/189.03
See application file for complete search history.

(56) References Cited

U.S. PATENT DOCUMENTS

| | | | |
|---|---|---|---|
| 3,800,292 A | 3/1974 | Curley et al. | |
| 4,069,452 A | 1/1978 | Conway et al. | |
| 4,323,965 A | 4/1982 | Johnson et al. | |
| 4,334,307 A | 6/1982 | Bourgeois et al. | |
| 4,345,319 A | 8/1982 | Bernardini et al. | |
| 4,392,212 A | 7/1983 | Miyasaka et al. | 365/230 |
| 4,566,082 A | 1/1986 | Anderson | |
| 4,592,019 A | 5/1986 | Huang et al. | 365/78 |
| 4,698,748 A | 10/1987 | Juzswik et al. | 364/200 |
| 4,710,903 A | 12/1987 | Hereth et al. | 365/194 |
| 4,780,843 A | 10/1988 | Tietjen | 364/900 |
| 4,794,597 A | 12/1988 | Ooba et al. | |
| 4,796,232 A | 1/1989 | House | 365/189 |
| 4,807,191 A | 2/1989 | Flannagan | |
| 4,841,440 A | 6/1989 | Yonezu et al. | 364/200 |
| 4,862,347 A | 8/1989 | Rudy | |
| 4,887,240 A | 12/1989 | Garverick et al. | 361/222 |
| 4,888,687 A | 12/1989 | Allison et al. | |
| 4,899,107 A | 2/1990 | Corbett et al. | 324/158 |
| 4,912,678 A | 3/1990 | Mashiko | |
| 4,922,451 A | 5/1990 | Lo et al. | |

(Continued)

FOREIGN PATENT DOCUMENTS

| | | |
|---|---|---|
| DE | 102004051345 | 5/2006 |
| DE | 102004053316 | 5/2006 |

(Continued)

OTHER PUBLICATIONS

Kellerbauer "Die Schnelle Million," with translation, "The quick million."
Wu et al., "eNVy: A Non-Volatile, Main Memory Storage System," to appear in ASPLOS VI.
"Using Two Chip Selects to Enable Quad Rank," IP.com PriorArtDatabase, copyright IP.com, Inc. 2004.
"BIOS and Kernel Developer's Guide (BKDG) for AMD Family 10h Processors," AMD, 31116 Rev 3.00, Sep. 7, 2007.
Skerlj et al., ":Buffer Device for Memory Modules (DIMM)" Qimonda 2006, p. 1.
Written Opinion from PCT Application No. PCT/US06/24360 mailed on Jan. 8, 2007.

(Continued)

*Primary Examiner* — Tan T. Nguyen
(74) *Attorney, Agent, or Firm* — Fish & Richardson P.C.

(57) ABSTRACT

A system is provided for multi-rank, partial-width memory modules. A memory controller is provided. Additionally, a memory bus is provided. Further, a memory module with a plurality of ranks of memory circuits is provided, the memory module including a first number of data pins that is less than a second number of data pins of the memory bus.

20 Claims, 11 Drawing Sheets

U.S. PATENT DOCUMENTS

| | | | |
|---|---|---|---|
| 4,935,734 A | 6/1990 | Austin | 340/825.83 |
| 4,937,791 A | 6/1990 | Steele et al. | |
| 4,956,694 A | 9/1990 | Eide | |
| 5,025,364 A | 6/1991 | Zellmer | |
| 5,072,424 A | 12/1991 | Brent et al. | 365/189 |
| 5,083,266 A | 1/1992 | Watanabe | 395/275 |
| 5,193,072 A | 3/1993 | Frenkil et al. | |
| 5,212,666 A | 5/1993 | Takeda | |
| 5,220,672 A | 6/1993 | Nakao et al. | 395/750 |
| 5,241,266 A | 8/1993 | Ahmad et al. | 324/158 |
| 5,252,807 A | 10/1993 | Chizinsky | 219/390 |
| 5,257,233 A | 10/1993 | Schaefer | 365/227 |
| 5,278,796 A | 1/1994 | Tillinghast et al. | 365/211 |
| 5,282,177 A | 1/1994 | McLaury | 365/230 |
| 5,332,922 A | 7/1994 | Oguchi et al. | 257/723 |
| 5,369,749 A | 11/1994 | Baker et al. | |
| 5,384,745 A | 1/1995 | Konishi et al. | 365/230.03 |
| 5,388,265 A | 2/1995 | Volk | 395/750 |
| 5,390,334 A | 2/1995 | Harrison | |
| 5,392,251 A | 2/1995 | Manning | |
| 5,408,190 A | 4/1995 | Wood et al. | 324/765 |
| 5,453,434 A | 9/1995 | Albaugh et al. | 514/397 |
| 5,467,455 A | 11/1995 | Gay et al. | 395/281 |
| 5,483,497 A | 1/1996 | Mochizuki et al. | |
| 5,498,886 A | 3/1996 | Hsu et al. | 257/213 |
| 5,502,333 A | 3/1996 | Bertin et al. | |
| 5,513,135 A | 4/1996 | Dell et al. | |
| 5,513,339 A | 4/1996 | Agrawal et al. | |
| 5,519,832 A | 5/1996 | Warchol | |
| 5,526,320 A | 6/1996 | Zagar et al. | 365/233 |
| 5,530,836 A | 6/1996 | Busch et al. | 395/477 |
| 5,550,781 A | 8/1996 | Sugawara et al. | |
| 5,559,990 A | 9/1996 | Cheng et al. | 395/484 |
| 5,566,344 A | 10/1996 | Hall et al. | 395/800 |
| 5,581,779 A | 12/1996 | Hall et al. | 395/800 |
| 5,590,071 A | 12/1996 | Kolor et al. | 365/149 |
| 5,598,376 A | 1/1997 | Merritt et al. | 365/230 |
| 5,604,714 A | 2/1997 | Manning et al. | 365/230 |
| 5,606,710 A | 2/1997 | Hall et al. | 395/800 |
| 5,608,262 A | 3/1997 | Degani et al. | |
| 5,610,864 A | 3/1997 | Manning | 365/193 |
| 5,623,686 A | 4/1997 | Hall et al. | 395/800 |
| 5,627,791 A | 5/1997 | Wright et al. | 365/222 |
| 5,640,337 A | 6/1997 | Huang et al. | 364/578 |
| 5,640,364 A | 6/1997 | Merritt et al. | 365/233 |
| 5,652,724 A | 7/1997 | Manning | 365/189 |
| 5,654,204 A | 8/1997 | Anderson | 438/15 |
| 5,661,677 A | 8/1997 | Rondeau et al. | 365/63 |
| 5,661,695 A | 8/1997 | Zagar et al. | 365/233 |
| 5,668,773 A | 9/1997 | Zagar et al. | 365/233 |
| 5,675,549 A | 10/1997 | Ong et al. | 365/233 |
| 5,682,354 A | 10/1997 | Manning | 365/233 |
| 5,692,121 A | 11/1997 | Bozso et al. | |
| 5,692,202 A | 11/1997 | Kardach et al. | 395/750 |
| 5,696,732 A | 12/1997 | Zagar et al. | 365/233 |
| 5,703,813 A | 12/1997 | Manning et al. | 365/189 |
| 5,706,247 A | 1/1998 | Merritt et al. | 365/233 |
| RE35,733 E | 2/1998 | Hernandez et al. | |
| 5,717,654 A | 2/1998 | Manning | 365/233 |
| 5,721,859 A | 2/1998 | Manning | 397/421 |
| 5,724,288 A | 3/1998 | Cloud et al. | 365/193 |
| 5,729,503 A | 3/1998 | Manning | 365/233 |
| 5,729,504 A | 3/1998 | Cowles | 365/236 |
| 5,742,792 A | 4/1998 | Yanai et al. | |
| 5,748,914 A | 5/1998 | Barth et al. | 395/285 |
| 5,752,045 A | 5/1998 | Chen | 395/750 |
| 5,757,703 A | 5/1998 | Merritt et al. | 365/189 |
| 5,760,478 A | 6/1998 | Bozso et al. | |
| 5,761,703 A | 6/1998 | Bolyn | 711/106 |
| 5,781,766 A | 7/1998 | Davis | 395/552 |
| 5,787,457 A | 7/1998 | Miller et al. | |
| 5,798,961 A | 8/1998 | Heyden et al. | 365/52 |
| 5,802,010 A | 9/1998 | Zagar et al. | 365/233 |
| 5,802,395 A | 9/1998 | Connolly et al. | |
| 5,802,555 A | 9/1998 | Shigeeda | 711/106 |
| 5,812,488 A | 9/1998 | Zagar et al. | 365/233 |
| 5,819,065 A | 10/1998 | Chilton et al. | |
| 5,831,833 A | 11/1998 | Shirakawa et al. | |
| 5,831,931 A | 11/1998 | Manning | 365/233 |
| 5,831,932 A | 11/1998 | Merritt et al. | 365/233 |
| 5,834,838 A | 11/1998 | Anderson | 257/697 |
| 5,835,435 A | 11/1998 | Bogin et al. | 365/22 |
| 5,838,165 A | 11/1998 | Chatter | |
| 5,838,177 A | 11/1998 | Keeth | 327/108 |
| 5,841,580 A | 11/1998 | Farmwald et al. | 365/194 |
| 5,843,799 A | 12/1998 | Hsu et al. | 438/6 |
| 5,845,108 A | 12/1998 | Yoo et al. | 395/551 |
| 5,850,368 A | 12/1998 | Ong et al. | 365/238 |
| 5,859,792 A | 1/1999 | Rondeau et al. | 365/52 |
| 5,860,106 A | 1/1999 | Domen et al. | 711/137 |
| 5,870,347 A | 2/1999 | Keeth et al. | 365/230 |
| 5,870,350 A | 2/1999 | Bertin et al. | |
| 5,872,907 A | 2/1999 | Griess et al. | |
| 5,875,142 A | 2/1999 | Chevallier | 365/212 |
| 5,878,279 A | 3/1999 | Athenes | |
| 5,884,088 A | 3/1999 | Kardach et al. | 395/750.06 |
| 5,901,105 A | 5/1999 | Ong et al. | 365/230.06 |
| 5,903,500 A | 5/1999 | Tsang et al. | 365/189.05 |
| 5,905,688 A | 5/1999 | Park | 365/227 |
| 5,907,512 A | 5/1999 | Parkinson et al. | 365/195 |
| 5,913,072 A | 6/1999 | Wieringa | |
| 5,915,105 A | 6/1999 | Farmwald et al. | 395/309 |
| 5,915,167 A | 6/1999 | Leedy | |
| 5,917,758 A | 6/1999 | Keeth | 365/189.05 |
| 5,923,611 A | 7/1999 | Ryan | 365/233 |
| 5,924,111 A | 7/1999 | Huang et al. | |
| 5,926,435 A | 7/1999 | Park et al. | |
| 5,929,650 A | 7/1999 | Pappert et al. | 324/763 |
| 5,943,254 A | 8/1999 | Bakeman, Jr. et al. | |
| 5,946,265 A | 8/1999 | Cowles | 365/233 |
| 5,949,254 A | 9/1999 | Keeth | 326/87 |
| 5,953,263 A | 9/1999 | Farmwald et al. | 365/194 |
| 5,954,804 A | 9/1999 | Farmwald et al. | 710/36 |
| 5,962,435 A | 10/1999 | Mao et al. | 514/63 |
| 5,963,429 A | 10/1999 | Chen | |
| 5,963,463 A | 10/1999 | Rondeau et al. | 365/52 |
| 5,963,464 A | 10/1999 | Dell et al. | |
| 5,963,504 A | 10/1999 | Manning | 365/233 |
| 5,966,724 A | 10/1999 | Ryan | 711/105 |
| 5,966,727 A | 10/1999 | Nishino | 711/127 |
| 5,969,996 A | 10/1999 | Muranaka et al. | 365/189.01 |
| 5,978,304 A * | 11/1999 | Crafts | 365/230.03 |
| 5,995,424 A | 11/1999 | Lawrence et al. | |
| 5,995,443 A | 11/1999 | Farmwald et al. | 365/233 |
| 6,001,671 A | 12/1999 | Fjelstad | |
| 6,002,613 A | 12/1999 | Cloud et al. | 365/189 |
| 6,002,627 A | 12/1999 | Chevallier | 365/212 |
| 6,014,339 A | 1/2000 | Kobayashi et al. | 365/233 |
| 6,016,282 A | 1/2000 | Keeth | 365/233 |
| 6,026,050 A | 2/2000 | Baker et al. | 365/233 |
| 6,029,250 A | 2/2000 | Keeth | 713/400 |
| 6,032,214 A | 2/2000 | Farmwald et al. | 710/129 |
| 6,032,215 A | 2/2000 | Farmwald et al. | 710/129 |
| 6,034,916 A | 3/2000 | Lee | 365/233 |
| 6,034,918 A | 3/2000 | Farmwald et al. | 365/233 |
| 6,035,365 A | 3/2000 | Farmwald et al. | 710/129 |
| 6,038,195 A | 3/2000 | Farmwald et al. | 365/233 |
| 6,038,673 A | 3/2000 | Benn et al. | 713/323 |
| 6,044,032 A | 3/2000 | Li | 365/230 |
| 6,047,073 A | 4/2000 | Norris et al. | |
| 6,047,344 A | 4/2000 | Kawasumi et al. | 710/107 |
| 6,053,948 A | 4/2000 | Vaidyanathan et al. | 703/14 |
| 6,058,451 A | 5/2000 | Bermingham et al. | |
| 6,065,092 A | 5/2000 | Roy | |
| 6,069,504 A | 5/2000 | Keeth | 327/108 |
| 6,073,223 A | 6/2000 | McAllister et al. | 711/167 |
| 6,075,730 A | 6/2000 | Barth et al. | 365/191 |
| 6,075,744 A | 6/2000 | Tsern et al. | 365/230 |
| 6,078,546 A | 6/2000 | Lee | 365/233 |
| 6,079,025 A | 6/2000 | Fung | 713/323 |
| 6,084,434 A | 7/2000 | Keeth | 326/87 |
| 6,088,290 A | 7/2000 | Ohtake et al. | 365/233 |
| 6,091,251 A | 7/2000 | Wood et al. | 324/755 |
| RE36,839 E | 8/2000 | Simmons et al. | 326/93 |
| 6,101,152 A | 8/2000 | Farmwald et al. | 365/233 |
| 6,101,564 A | 8/2000 | Athenes et al. | |
| 6,101,612 A | 8/2000 | Jeddeloh | 713/401 |

| Patent No. | Kind | Date | Inventor(s) | Class |
|---|---|---|---|---|
| 6,108,795 | A | 8/2000 | Jeddeloh | 713/401 |
| 6,111,812 | A | 8/2000 | Gans et al. | 365/233 |
| 6,134,638 | A | 10/2000 | Olarig et al. | 711/167 |
| 6,154,370 | A | 11/2000 | Degani et al. | |
| 6,166,991 | A | 12/2000 | Phelan | 365/233 |
| 6,181,640 | B1 | 1/2001 | Kang | |
| 6,182,184 | B1 | 1/2001 | Farmwald et al. | 710/129 |
| 6,199,151 | B1 | 3/2001 | Williams et al. | |
| 6,208,168 | B1 | 3/2001 | Rhee | 326/83 |
| 6,216,246 | B1 | 4/2001 | Shau | 714/763 |
| 6,222,739 | B1 | 4/2001 | Bhakta et al. | |
| 6,226,709 | B1 | 5/2001 | Goodwin et al. | |
| 6,226,730 | B1 | 5/2001 | Murdoch et al. | |
| 6,233,192 | B1 | 5/2001 | Tanaka | |
| 6,233,650 | B1 | 5/2001 | Johnson et al. | |
| 6,240,048 | B1 | 5/2001 | Matsubara | 365/233 |
| 6,243,282 | B1 | 6/2001 | Rondeau et al. | 365/52 |
| 6,252,807 | B1 | 6/2001 | Suzuki et al. | |
| 6,253,278 | B1 * | 6/2001 | Ryan | 711/105 |
| 6,260,097 | B1 | 7/2001 | Farmwald et al. | 710/129 |
| 6,260,154 | B1 | 7/2001 | Jeddeloh | 713/401 |
| 6,262,938 | B1 | 7/2001 | Lee et al. | 365/233 |
| 6,266,285 | B1 | 7/2001 | Farmwald et al. | 365/194 |
| 6,266,292 | B1 | 7/2001 | Tsern et al. | 365/230 |
| 6,274,395 | B1 | 8/2001 | Weber | 438/14 |
| 6,279,069 | B1 | 8/2001 | Robinson et al. | 711/103 |
| 6,295,572 | B1 | 9/2001 | Wu | 710/131 |
| 6,298,426 | B1 | 10/2001 | Ajanovic | 711/172 |
| 6,304,511 | B1 | 10/2001 | Gans et al. | 365/233 |
| 6,307,769 | B1 | 10/2001 | Nuxoll et al. | 365/63 |
| 6,314,051 | B1 | 11/2001 | Farmwald et al. | 365/233 |
| 6,317,352 | B1 | 11/2001 | Halbert et al. | 365/52 |
| 6,317,381 | B1 | 11/2001 | Gans et al. | 365/233 |
| 6,324,120 | B2 | 11/2001 | Farmwald et al. | 365/233 |
| 6,326,810 | B1 | 12/2001 | Keeth | 326/83 |
| 6,327,664 | B1 | 12/2001 | Dell et al. | 713/323 |
| 6,330,683 | B1 | 12/2001 | Jeddeloh | 713/401 |
| 6,336,174 | B1 | 1/2002 | Li et al. | |
| 6,338,108 | B1 | 1/2002 | Motomura | 710/110 |
| 6,338,113 | B1 | 1/2002 | Kubo et al. | 711/105 |
| 6,341,347 | B1 | 1/2002 | Joy et al. | 712/228 |
| 6,343,019 | B1 | 1/2002 | Jiang et al. | |
| 6,343,042 | B1 | 1/2002 | Tsern et al. | 365/222 |
| 6,353,561 | B1 | 3/2002 | Funyu et al. | 365/195 |
| 6,356,105 | B1 | 3/2002 | Volk | 326/30 |
| 6,356,500 | B1 | 3/2002 | Cloud et al. | 365/226 |
| 6,362,656 | B2 | 3/2002 | Rhee | 326/87 |
| 6,363,031 | B2 | 3/2002 | Phelan | 365/233 |
| 6,378,020 | B2 | 4/2002 | Farmwald et al. | 710/129 |
| 6,381,188 | B1 | 4/2002 | Choi et al. | 365/222 |
| 6,381,668 | B1 | 4/2002 | Lunteren | 711/5 |
| 6,389,514 | B1 | 5/2002 | Rokicki | |
| 6,392,304 | B1 | 5/2002 | Butler | |
| 6,414,868 | B1 | 7/2002 | Wong et al. | 365/51 |
| 6,418,034 | B1 | 7/2002 | Weber et al. | |
| 6,421,754 | B1 | 7/2002 | Kau et al. | |
| 6,424,532 | B2 | 7/2002 | Kawamura | |
| 6,426,916 | B2 | 7/2002 | Farmwald et al. | 365/233 |
| 6,429,029 | B1 | 8/2002 | Eldridge et al. | 438/14 |
| 6,430,103 | B2 | 8/2002 | Nakayama et al. | 365/230.03 |
| 6,437,600 | B1 | 8/2002 | Keeth | 326/86 |
| 6,438,057 | B1 | 8/2002 | Ruckerbauer | 365/222 |
| 6,442,698 | B2 | 8/2002 | Nizar | 13/320 |
| 6,445,591 | B1 | 9/2002 | Kwong | |
| 6,452,863 | B2 | 9/2002 | Farmwald et al. | 365/233 |
| 6,453,400 | B1 | 9/2002 | Maesako et al. | 711/167 |
| 6,453,402 | B1 | 9/2002 | Jeddeloh | 711/167 |
| 6,453,434 | B2 | 9/2002 | Delp et al. | |
| 6,455,348 | B1 | 9/2002 | Yamaguchi | |
| 6,457,095 | B1 | 9/2002 | Volk | 711/105 |
| 6,459,651 | B1 | 10/2002 | Lee et al. | 365/233 |
| 6,473,831 | B1 | 10/2002 | Schade | 711/115 |
| 6,476,476 | B1 | 11/2002 | Glenn | |
| 6,480,929 | B1 | 11/2002 | Gauthier et al. | 711/105 |
| 6,489,669 | B2 | 12/2002 | Shimada et al. | |
| 6,490,161 | B1 | 12/2002 | Johnson | |
| 6,492,726 | B1 | 12/2002 | Quek et al. | |
| 6,493,789 | B2 | 12/2002 | Ware et al. | 711/105 |
| 6,496,440 | B2 | 12/2002 | Manning | 365/230.03 |
| 6,496,897 | B2 | 12/2002 | Ware et al. | 711/105 |
| 6,498,766 | B2 | 12/2002 | Lee et al. | 365/233 |
| 6,510,097 | B2 | 1/2003 | Fukuyama | 365/230.03 |
| 6,510,503 | B2 | 1/2003 | Gillingham et al. | 711/167 |
| 6,512,392 | B2 | 1/2003 | Fleury et al. | 324/765 |
| 6,521,984 | B2 | 2/2003 | Matsuura | |
| 6,526,471 | B1 | 2/2003 | Shimomura et al. | 711/5 |
| 6,526,473 | B1 | 2/2003 | Kim | |
| 6,526,484 | B1 | 2/2003 | Stacovsky et al. | 711/158 |
| 6,546,446 | B2 | 4/2003 | Farmwald et al. | 710/305 |
| 6,553,450 | B1 | 4/2003 | Dodd et al. | 711/105 |
| 6,560,158 | B2 | 5/2003 | Choi et al. | 365/226 |
| 6,563,337 | B2 | 5/2003 | Dour | 326/30 |
| 6,563,759 | B2 | 5/2003 | Yahata et al. | 365/233 |
| 6,564,281 | B2 | 5/2003 | Farmwald et al. | 710/305 |
| 6,564,285 | B1 | 5/2003 | Mills et al. | 711/103 |
| 6,574,150 | B2 | 6/2003 | Suyama et al. | 365/189.05 |
| 6,584,037 | B2 | 6/2003 | Farmwald et al. | 365/233 |
| 6,587,912 | B2 | 7/2003 | Leddige et al. | 711/5 |
| 6,590,822 | B2 | 7/2003 | Hwang et al. | 365/222 |
| 6,594,770 | B1 | 7/2003 | Sato et al. | 713/320 |
| 6,597,616 | B2 | 7/2003 | Tsern et al. | 365/222 |
| 6,597,617 | B2 | 7/2003 | Ooishi et al. | |
| 6,614,700 | B2 | 9/2003 | Dietrich et al. | 365/194 |
| 6,618,267 | B1 | 9/2003 | Dalal et al. | |
| 6,618,791 | B1 | 9/2003 | Dodd et al. | 711/105 |
| 6,621,760 | B1 | 9/2003 | Ahmad et al. | 365/233 |
| 6,628,538 | B2 | 9/2003 | Funaba et al. | |
| 6,630,729 | B2 | 10/2003 | Huang | |
| 6,631,086 | B1 | 10/2003 | Bill et al. | 365/185.09 |
| 6,646,939 | B2 | 11/2003 | Kwak | |
| 6,650,588 | B2 | 11/2003 | Yamagata | 365/222 |
| 6,650,594 | B1 | 11/2003 | Lee et al. | 365/233 |
| 6,657,634 | B1 | 12/2003 | Sinclair et al. | |
| 6,657,918 | B2 | 12/2003 | Foss et al. | 365/233 |
| 6,657,919 | B2 | 12/2003 | Foss et al. | 365/233 |
| 6,658,016 | B1 | 12/2003 | Dai et al. | |
| 6,658,530 | B1 | 12/2003 | Robertson et al. | 711/115 |
| 6,659,512 | B1 | 12/2003 | Harper et al. | |
| 6,664,625 | B2 | 12/2003 | Hiruma | |
| 6,665,224 | B1 | 12/2003 | Lehmann et al. | 365/222 |
| 6,665,227 | B2 | 12/2003 | Fetzer | 365/229 |
| 6,668,242 | B1 | 12/2003 | Reynov et al. | |
| 6,674,154 | B2 | 1/2004 | Minamio et al. | |
| 6,684,292 | B2 | 1/2004 | Piccirillo et al. | |
| 6,690,191 | B2 | 2/2004 | Wu et al. | |
| 6,697,295 | B2 | 2/2004 | Farmwald et al. | 365/233 |
| 6,701,446 | B2 | 3/2004 | Tsern et al. | 713/501 |
| 6,708,144 | B1 | 3/2004 | Merryman et al. | 703/14 |
| 6,710,430 | B2 | 3/2004 | Minamio et al. | |
| 6,711,043 | B2 | 3/2004 | Friedman et al. | |
| 6,713,856 | B2 | 3/2004 | Tsai et al. | |
| 6,714,891 | B2 | 3/2004 | Dendinger | 702/132 |
| 6,724,684 | B2 | 4/2004 | Kim | 365/233 |
| 6,730,540 | B2 | 5/2004 | Siniaguine | |
| 6,731,009 | B1 | 5/2004 | Jones et al. | |
| 6,731,527 | B2 | 5/2004 | Brown | 365/63 |
| 6,742,098 | B1 | 5/2004 | Halbert et al. | |
| 6,744,687 | B2 | 6/2004 | Koo et al. | 365/226 |
| 6,747,887 | B2 | 6/2004 | Halbert et al. | |
| 6,751,113 | B2 | 6/2004 | Bhakta et al. | |
| 6,751,696 | B2 | 6/2004 | Farmwald et al. | 710/305 |
| 6,754,129 | B2 | 6/2004 | Khatri et al. | 365/226 |
| 6,754,132 | B2 | 6/2004 | Kyung | 365/233 |
| 6,762,948 | B2 | 7/2004 | Kyun et al. | 365/51 |
| 6,765,812 | B2 | 7/2004 | Anderson | |
| 6,766,469 | B2 | 7/2004 | Larson et al. | |
| 6,771,526 | B2 | 8/2004 | LaBerge | |
| 6,772,359 | B2 | 8/2004 | Kwak et al. | |
| 6,779,097 | B2 | 8/2004 | Gillingham et al. | 711/167 |
| 6,785,767 | B2 | 8/2004 | Coulson | 711/112 |
| 6,791,877 | B2 | 9/2004 | Miura et al. | 365/185 |
| 6,795,899 | B2 | 9/2004 | Dodd et al. | 711/137 |
| 6,799,241 | B2 | 9/2004 | Kahn et al. | 711/105 |
| 6,801,989 | B2 | 10/2004 | Johnson et al. | 711/167 |
| 6,807,598 | B2 | 10/2004 | Farmwald et al. | 710/305 |
| 6,807,650 | B2 * | 10/2004 | Lamb et al. | 716/101 |
| 6,807,655 | B1 | 10/2004 | Rehani et al. | 716/4 |
| 6,816,991 | B2 | 11/2004 | Sanghani | 714/733 |

| Patent | Kind | Date | Name | Class |
|---|---|---|---|---|
| 6,819,602 | B2 | 11/2004 | Seo et al. | 365/193 |
| 6,819,617 | B2 | 11/2004 | Hwang et al. | 365/222 |
| 6,820,163 | B1 | 11/2004 | McCall et al. | 710/310 |
| 6,820,169 | B2 | 11/2004 | Wilcox et al. | 711/105 |
| 6,826,104 | B2 | 11/2004 | Kawaguchi et al. | 365/222 |
| 6,839,290 | B2 | 1/2005 | Ahmad et al. | 365/193 |
| 6,845,027 | B2 | 1/2005 | Mayer et al. | |
| 6,845,055 | B1 | 1/2005 | Koga et al. | 365/229 |
| 6,847,582 | B2 | 1/2005 | Pan | 365/233 |
| 6,850,449 | B2 | 2/2005 | Takahashi | 365/222 |
| 6,854,043 | B2 | 2/2005 | Hargis et al. | |
| 6,862,202 | B2 | 3/2005 | Schaefer | |
| 6,862,249 | B2 | 3/2005 | Kyung | 365/233 |
| 6,862,653 | B1 | 3/2005 | Dodd et al. | 711/105 |
| 6,873,534 | B2 | 3/2005 | Bhakta et al. | |
| 6,878,570 | B2 | 4/2005 | Lyu et al. | |
| 6,894,933 | B2 | 5/2005 | Kuzmenka et al. | 365/189.05 |
| 6,898,683 | B2 | 5/2005 | Nakamura | 711/167 |
| 6,908,314 | B2 | 6/2005 | Brown | 439/68 |
| 6,912,778 | B2 | 7/2005 | Ahn et al. | 29/852 |
| 6,914,786 | B1 | 7/2005 | Paulsen et al. | |
| 6,917,219 | B2 | 7/2005 | New | 326/41 |
| 6,922,371 | B2 | 7/2005 | Takahashi et al. | 365/227 |
| 6,930,900 | B2 | 8/2005 | Bhakta et al. | |
| 6,930,903 | B2 | 8/2005 | Bhakta et al. | |
| 6,938,119 | B2 | 8/2005 | Kohn et al. | 711/105 |
| 6,943,450 | B2 | 9/2005 | Fee et al. | |
| 6,944,748 | B2 | 9/2005 | Sanches et al. | |
| 6,947,341 | B2 | 9/2005 | Stubbs et al. | |
| 6,951,982 | B2 | 10/2005 | Chye et al. | |
| 6,952,794 | B2 | 10/2005 | Lu | |
| 6,961,281 | B2 | 11/2005 | Wong et al. | 365/230.03 |
| 6,968,416 | B2 | 11/2005 | Moy | 710/310 |
| 6,968,419 | B1 | 11/2005 | Holman | 711/5 |
| 6,970,968 | B1 | 11/2005 | Holman | 711/5 |
| 6,980,021 | B1 | 12/2005 | Srivastava et al. | 326/30 |
| 6,986,118 | B2 | 1/2006 | Dickman | 716/8 |
| 6,992,501 | B2 | 1/2006 | Rapport | |
| 6,992,950 | B2 | 1/2006 | Foss et al. | 365/233 |
| 7,000,062 | B2 | 2/2006 | Perego et al. | 711/5 |
| 7,003,618 | B2 | 2/2006 | Perego et al. | 711/5 |
| 7,003,639 | B2 | 2/2006 | Tsern et al. | 711/154 |
| 7,007,095 | B2 | 2/2006 | Chen et al. | |
| 7,007,175 | B2 | 2/2006 | Chang et al. | 713/300 |
| 7,010,642 | B2 | 3/2006 | Perego et al. | 711/5 |
| 7,010,736 | B1 | 3/2006 | Teh et al. | 714/733 |
| 7,024,518 | B2 | 4/2006 | Halbert et al. | 711/115 |
| 7,026,708 | B2 | 4/2006 | Cady et al. | |
| 7,028,215 | B2 | 4/2006 | Depew et al. | |
| 7,028,234 | B2 | 4/2006 | Huckaby et al. | 714/710 |
| 7,033,861 | B1 | 4/2006 | Partridge et al. | |
| 7,035,150 | B2 | 4/2006 | Streif et al. | 365/194 |
| 7,043,599 | B1 | 5/2006 | Ware et al. | 711/106 |
| 7,043,611 | B2 | 5/2006 | McClannahan et al. | |
| 7,045,396 | B2 | 5/2006 | Crowley et al. | |
| 7,045,901 | B2 | 5/2006 | Lin et al. | |
| 7,046,538 | B2 | 5/2006 | Kinsley et al. | |
| 7,053,470 | B1 | 5/2006 | Sellers et al. | |
| 7,053,478 | B2 | 5/2006 | Roper et al. | |
| 7,058,776 | B2 | 6/2006 | Lee | 711/167 |
| 7,058,863 | B2 | 6/2006 | Kouchi et al. | 714/718 |
| 7,061,784 | B2 | 6/2006 | Jakobs et al. | |
| 7,061,823 | B2 | 6/2006 | Faue et al. | 365/230.08 |
| 7,066,741 | B2 | 6/2006 | Burns et al. | |
| 7,075,175 | B2 | 7/2006 | Kazi et al. | 257/678 |
| 7,079,396 | B2 | 7/2006 | Gates et al. | |
| 7,079,441 | B1 | 7/2006 | Partsch et al. | 365/226 |
| 7,079,446 | B2 | 7/2006 | Murtagh et al. | 365/233 |
| 7,085,152 | B2 | 8/2006 | Ellis et al. | 365/149 |
| 7,085,941 | B2 | 8/2006 | Li | 713/300 |
| 7,089,438 | B2 | 8/2006 | Raad | 713/322 |
| 7,093,101 | B2 | 8/2006 | Aasheim et al. | 711/207 |
| 7,103,730 | B2 | 9/2006 | Saxena et al. | 711/156 |
| 7,119,428 | B2 | 10/2006 | Tanie et al. | |
| 7,120,727 | B2 | 10/2006 | Lee et al. | 711/5 |
| 7,126,399 | B1 | 10/2006 | Lee | 327/261 |
| 7,127,567 | B2 | 10/2006 | Ramakrishnan et al. | |
| 7,133,960 | B1 | 11/2006 | Thompson et al. | 711/5 |
| 7,136,978 | B2 | 11/2006 | Miura et al. | 711/165 |
| 7,138,823 | B2 | 11/2006 | Janzen et al. | |
| 7,149,145 | B2 | 12/2006 | Kim et al. | 365/233 |
| 7,149,824 | B2 | 12/2006 | Johnson | 710/35 |
| 7,173,863 | B2 | 2/2007 | Conley et al. | 365/189 |
| 7,200,021 | B2 | 4/2007 | Raghuram | 365/51 |
| 7,205,789 | B1 | 4/2007 | Karabatsos | 326/30 |
| 7,210,059 | B2 | 4/2007 | Jeddeloh | |
| 7,215,561 | B2 | 5/2007 | Park et al. | |
| 7,218,566 | B1 | 5/2007 | Totolos, Jr. et al. | |
| 7,224,595 | B2 | 5/2007 | Dreps et al. | 365/63 |
| 7,228,264 | B2 | 6/2007 | Barrenscheen et al. | 703/23 |
| 7,231,562 | B2 | 6/2007 | Ohlhoff et al. | |
| 7,233,541 | B2 | 6/2007 | Yamamoto et al. | 365/230.03 |
| 7,234,081 | B2 | 6/2007 | Nguyen et al. | |
| 7,243,185 | B2 | 7/2007 | See et al. | |
| 7,245,541 | B2 | 7/2007 | Janzen | 365/198 |
| 7,254,036 | B2 | 8/2007 | Pauley et al. | 361/721 |
| 7,266,639 | B2 | 9/2007 | Raghuram | 711/115 |
| 7,269,042 | B2 | 9/2007 | Kinsley et al. | 365/52 |
| 7,269,708 | B2 | 9/2007 | Ware | 711/203 |
| 7,274,583 | B2 | 9/2007 | Park et al. | |
| 7,277,333 | B2 | 10/2007 | Schaefer | |
| 7,286,436 | B2 * | 10/2007 | Bhakta et al. | 365/230.02 |
| 7,289,386 | B2 | 10/2007 | Bhakta et al. | 365/230 |
| 7,296,754 | B2 | 11/2007 | Nishizawa et al. | 235/492 |
| 7,299,330 | B2 | 11/2007 | Gillingham et al. | 711/167 |
| 7,302,598 | B2 | 11/2007 | Suzuki et al. | |
| 7,307,863 | B2 | 12/2007 | Yen et al. | 365/63 |
| 7,317,250 | B2 | 1/2008 | Koh et al. | |
| 7,327,613 | B2 * | 2/2008 | Lee | 365/189.02 |
| 7,337,293 | B2 | 2/2008 | Brittain et al. | |
| 7,363,422 | B2 | 4/2008 | Perego et al. | 711/105 |
| 7,366,947 | B2 | 4/2008 | Gower et al. | |
| 7,379,316 | B2 | 5/2008 | Rajan | 365/63 |
| 7,386,656 | B2 | 6/2008 | Rajan et al. | 711/103 |
| 7,392,338 | B2 | 6/2008 | Rajan et al. | 711/103 |
| 7,408,393 | B1 | 8/2008 | Jain et al. | 327/202 |
| 7,409,492 | B2 | 8/2008 | Tanaka et al. | 711/103 |
| 7,428,644 | B2 | 9/2008 | Jeddeloh et al. | |
| 7,437,579 | B2 | 10/2008 | Jeddeloh et al. | 713/300 |
| 7,441,064 | B2 | 10/2008 | Gaskins | |
| 7,457,122 | B2 | 11/2008 | Lai et al. | |
| 7,464,225 | B2 | 12/2008 | Tsern | 711/115 |
| 7,472,220 | B2 | 12/2008 | Rajan et al. | 711/103 |
| 7,474,576 | B2 | 1/2009 | Co et al. | |
| 7,480,147 | B2 | 1/2009 | Hoss et al. | |
| 7,480,774 | B2 | 1/2009 | Ellis et al. | |
| 7,496,777 | B2 | 2/2009 | Kapil | 713/324 |
| 7,515,453 | B2 | 4/2009 | Rajan | 365/63 |
| 7,532,537 | B2 | 5/2009 | Solomon et al. | 365/230 |
| 7,539,800 | B2 | 5/2009 | Dell et al. | |
| 7,573,136 | B2 | 8/2009 | Jiang et al. | |
| 7,580,312 | B2 | 8/2009 | Rajan et al. | |
| 7,581,121 | B2 | 8/2009 | Barth et al. | |
| 7,581,127 | B2 | 8/2009 | Rajan et al. | |
| 7,590,796 | B2 | 9/2009 | Rajan et al. | |
| 7,599,205 | B2 | 10/2009 | Rajan | |
| 7,606,245 | B2 | 10/2009 | Ma et al. | |
| 7,609,567 | B2 | 10/2009 | Rajan et al. | |
| 7,613,880 | B2 | 11/2009 | Miura et al. | |
| 7,619,912 | B2 | 11/2009 | Bhakta et al. | |
| 7,724,589 | B2 | 5/2010 | Rajan et al. | |
| 7,730,338 | B2 | 6/2010 | Rajan et al. | |
| 7,761,724 | B2 | 7/2010 | Rajan et al. | |
| 7,934,070 | B2 | 4/2011 | Brittain et al. | |
| 7,990,797 | B2 | 8/2011 | Moshayedi et al. | |
| 8,116,144 | B2 * | 2/2012 | Shaw et al. | 365/189.03 |
| 2001/0000822 | A1 | 5/2001 | Dell et al. | 711/170 |
| 2001/0003198 | A1 | 6/2001 | Wu | |
| 2001/0011322 | A1 | 8/2001 | Stolt et al. | |
| 2001/0019509 | A1 | 9/2001 | Aho et al. | |
| 2001/0021106 | A1 | 9/2001 | Weber et al. | |
| 2001/0021137 | A1 | 9/2001 | Kai et al. | |
| 2001/0046129 | A1 | 11/2001 | Broglia et al. | |
| 2001/0046163 | A1 | 11/2001 | Yanagawa | |
| 2002/0002662 | A1 | 1/2002 | Olarig et al. | |
| 2002/0004897 | A1 | 1/2002 | Kao et al. | |
| 2002/0015340 | A1 | 2/2002 | Batinovich | |
| 2002/0019961 | A1 | 2/2002 | Blodgett | 714/718 |

| Publication No. | Date | Inventor | Class |
|---|---|---|---|
| 2002/0038405 A1 | 3/2002 | Leddige et al. | 711/115 |
| 2002/0041507 A1 | 4/2002 | Woo et al. | 365/51 |
| 2002/0051398 A1 | 5/2002 | Mizugaki | 365/222 |
| 2002/0060945 A1 | 5/2002 | Ikeda | |
| 2002/0060948 A1 | 5/2002 | Chang et al. | |
| 2002/0064073 A1 | 5/2002 | Chien | 365/200 |
| 2002/0064083 A1 | 5/2002 | Ryu et al. | 365/233 |
| 2002/0089970 A1 | 7/2002 | Asada et al. | |
| 2002/0094671 A1 | 7/2002 | Distefano et al. | |
| 2002/0121650 A1 | 9/2002 | Minamio et al. | |
| 2002/0121670 A1 | 9/2002 | Minamio et al. | |
| 2002/0124195 A1 | 9/2002 | Nizar | 713/320 |
| 2002/0129204 A1 | 9/2002 | Leighnor et al. | |
| 2002/0145900 A1 | 10/2002 | Schaefer | 365/52 |
| 2002/0165706 A1 | 11/2002 | Raynham | 703/25 |
| 2002/0167092 A1 | 11/2002 | Fee et al. | |
| 2002/0172024 A1 | 11/2002 | Hui et al. | |
| 2002/0174274 A1 | 11/2002 | Wu et al. | 710/100 |
| 2002/0184438 A1 | 12/2002 | Usui | 711/106 |
| 2003/0002262 A1 | 1/2003 | Benisek et al. | 361/728 |
| 2003/0011993 A1 | 1/2003 | Summers et al. | |
| 2003/0016550 A1 | 1/2003 | Yoo et al. | |
| 2003/0021175 A1 | 1/2003 | Tae Kwak | 365/219 |
| 2003/0026155 A1 | 2/2003 | Yamagata | |
| 2003/0026159 A1 | 2/2003 | Frankowsky et al. | |
| 2003/0039158 A1 | 2/2003 | Horiguchi et al. | |
| 2003/0041295 A1 | 2/2003 | Hou et al. | |
| 2003/0061458 A1 | 3/2003 | Wilcox et al. | 711/167 |
| 2003/0061459 A1 | 3/2003 | Aboulenein et al. | |
| 2003/0088743 A1 | 5/2003 | Rader | |
| 2003/0093614 A1 | 5/2003 | Kohn et al. | 711/105 |
| 2003/0101392 A1 | 5/2003 | Lee | 714/718 |
| 2003/0105932 A1 | 6/2003 | David et al. | 711/167 |
| 2003/0117875 A1 | 6/2003 | Lee et al. | 365/226 |
| 2003/0123389 A1 | 7/2003 | Russell et al. | |
| 2003/0126338 A1 | 7/2003 | Dodd et al. | 710/305 |
| 2003/0127737 A1 | 7/2003 | Takahashi | |
| 2003/0131160 A1 | 7/2003 | Hampel et al. | 710/22 |
| 2003/0145163 A1 | 7/2003 | Seo et al. | 711/106 |
| 2003/0158995 A1 | 8/2003 | Lee et al. | 711/105 |
| 2003/0164539 A1 | 9/2003 | Yau | |
| 2003/0164543 A1 | 9/2003 | Kheng Lee | |
| 2003/0182513 A1 | 9/2003 | Dodd et al. | 711/137 |
| 2003/0183934 A1 | 10/2003 | Barrett | |
| 2003/0189868 A1 | 10/2003 | Riesenman et al. | 365/226 |
| 2003/0189870 A1 | 10/2003 | Wilcox | 365/233 |
| 2003/0191888 A1 | 10/2003 | Klein | 711/105 |
| 2003/0191915 A1 | 10/2003 | Saxena et al. | 711/160 |
| 2003/0200382 A1 | 10/2003 | Wells et al. | 711/106 |
| 2003/0200474 A1 | 10/2003 | Li | 713/320 |
| 2003/0205802 A1 | 11/2003 | Segaram et al. | |
| 2003/0206476 A1 | 11/2003 | Joo | |
| 2003/0217303 A1 | 11/2003 | Chua-Eoan et al. | |
| 2003/0223290 A1 | 12/2003 | Park et al. | 365/200 |
| 2003/0227798 A1 | 12/2003 | Pax | 365/189.12 |
| 2003/0229821 A1 | 12/2003 | Ma | 714/8 |
| 2003/0230801 A1 | 12/2003 | Jiang et al. | |
| 2003/0231540 A1 | 12/2003 | Lazar et al. | |
| 2003/0231542 A1 | 12/2003 | Zaharinova-Papazova et al. | 365/226 |
| 2003/0234664 A1 | 12/2003 | Yamagata | |
| 2004/0016994 A1 | 1/2004 | Huang | |
| 2004/0027902 A1 | 2/2004 | Ooishi et al. | |
| 2004/0034732 A1 | 2/2004 | Valin et al. | 711/4 |
| 2004/0034755 A1 | 2/2004 | LaBerge et al. | |
| 2004/0037133 A1 | 2/2004 | Park et al. | 365/202 |
| 2004/0042503 A1 | 3/2004 | Shaeffer et al. | |
| 2004/0044808 A1 | 3/2004 | Salmon et al. | 710/8 |
| 2004/0047228 A1 | 3/2004 | Chen | 365/232 |
| 2004/0057317 A1 | 3/2004 | Schaefer | |
| 2004/0064647 A1 | 4/2004 | DeWhitt et al. | 711/135 |
| 2004/0064767 A1 | 4/2004 | Huckaby et al. | 714/710 |
| 2004/0083324 A1 | 4/2004 | Rabinovitz et al. | |
| 2004/0088475 A1 | 5/2004 | Streif et al. | 711/105 |
| 2004/0100837 A1 | 5/2004 | Lee | |
| 2004/0117723 A1 | 6/2004 | Foss | 714/805 |
| 2004/0123173 A1 | 6/2004 | Emberling et al. | 714/733 |
| 2004/0125635 A1 | 7/2004 | Kuzmenka | |
| 2004/0133732 A1 | 7/2004 | Minematsu et al. | 711/105 |
| 2004/0133736 A1 | 7/2004 | Kyung | 711/105 |
| 2004/0139359 A1 | 7/2004 | Samson et al. | 713/320 |
| 2004/0145963 A1 | 7/2004 | Byon | 365/233 |
| 2004/0151038 A1 | 8/2004 | Ruckerbauer et al. | |
| 2004/0174765 A1 | 9/2004 | Seo et al. | 365/233 |
| 2004/0177079 A1 | 9/2004 | Gluhovsky et al. | 707/100 |
| 2004/0178824 A1 | 9/2004 | Pan | |
| 2004/0184324 A1 | 9/2004 | Pax | 365/189.12 |
| 2004/0186956 A1 | 9/2004 | Perego et al. | 711/115 |
| 2004/0188704 A1 | 9/2004 | Halbert et al. | 257/145 |
| 2004/0196732 A1 | 10/2004 | Lee | 365/233 |
| 2004/0205433 A1 | 10/2004 | Gower et al. | |
| 2004/0208173 A1 | 10/2004 | Di Gregorio | 370/360 |
| 2004/0225858 A1 | 11/2004 | Brueggen | |
| 2004/0228166 A1 | 11/2004 | Braun et al. | 365/154 |
| 2004/0228196 A1 | 11/2004 | Kwak et al. | |
| 2004/0228203 A1 | 11/2004 | Koo | 365/233 |
| 2004/0230932 A1 | 11/2004 | Dickmann | 716/10 |
| 2004/0236877 A1 | 11/2004 | Burton | |
| 2004/0250989 A1 | 12/2004 | Im et al. | |
| 2004/0256638 A1 | 12/2004 | Perego et al. | 257/200 |
| 2004/0260957 A1 | 12/2004 | Jeddeloh et al. | 713/300 |
| 2004/0264255 A1 | 12/2004 | Royer | 365/189.01 |
| 2004/0268161 A1 | 12/2004 | Ross | 713/300 |
| 2005/0018495 A1 | 1/2005 | Bhakta et al. | 365/19 |
| 2005/0021874 A1 | 1/2005 | Georgiou et al. | 709/250 |
| 2005/0024963 A1 | 2/2005 | Jakobs et al. | |
| 2005/0027928 A1 | 2/2005 | Avraham et al. | 711/103 |
| 2005/0028038 A1 | 2/2005 | Pomaranski et al. | 714/42 |
| 2005/0034004 A1 | 2/2005 | Bunker et al. | |
| 2005/0044303 A1 | 2/2005 | Perego et al. | 711/5 |
| 2005/0044305 A1 | 2/2005 | Jakobs et al. | 711/105 |
| 2005/0047192 A1 | 3/2005 | Matsui et al. | 365/145 |
| 2005/0071543 A1 | 3/2005 | Ellis et al. | 711/105 |
| 2005/0078532 A1 | 4/2005 | Ruckerbauer et al. | 365/199 |
| 2005/0081085 A1 | 4/2005 | Ellis et al. | 714/5 |
| 2005/0086548 A1 | 4/2005 | Haid et al. | |
| 2005/0102590 A1 | 5/2005 | Norris et al. | 714/719 |
| 2005/0108460 A1 | 5/2005 | David | |
| 2005/0127531 A1 | 6/2005 | Tay et al. | |
| 2005/0132158 A1 | 6/2005 | Hampel et al. | 711/167 |
| 2005/0135176 A1 | 6/2005 | Ramakrishnan et al. | |
| 2005/0138267 A1 | 6/2005 | Bains et al. | 711/100 |
| 2005/0138304 A1 | 6/2005 | Ramakrishnan et al. | |
| 2005/0139977 A1 | 6/2005 | Nishio et al. | 257/686 |
| 2005/0141199 A1 | 6/2005 | Chiou et al. | 361/704 |
| 2005/0149662 A1 | 7/2005 | Perego et al. | 711/5 |
| 2005/0152212 A1 | 7/2005 | Yang et al. | 365/233 |
| 2005/0166026 A1 | 7/2005 | Ware et al. | 711/167 |
| 2005/0193163 A1 | 9/2005 | Perego et al. | 711/105 |
| 2005/0193183 A1 | 9/2005 | Barth et al. | |
| 2005/0194676 A1 | 9/2005 | Fukuda et al. | |
| 2005/0194991 A1 | 9/2005 | Dour et al. | 326/30 |
| 2005/0195629 A1 | 9/2005 | Leddige et al. | 365/51 |
| 2005/0201063 A1 | 9/2005 | Lee et al. | |
| 2005/0204111 A1 | 9/2005 | Natarajan | 711/167 |
| 2005/0210196 A1 | 9/2005 | Perego et al. | 711/115 |
| 2005/0223179 A1 | 10/2005 | Perego et al. | 711/154 |
| 2005/0232049 A1 | 10/2005 | Park | |
| 2005/0235119 A1 | 10/2005 | Sechrest et al. | 711/158 |
| 2005/0235131 A1 | 10/2005 | Ware | 711/203 |
| 2005/0237838 A1 | 10/2005 | Kwak et al. | 365/222 |
| 2005/0243635 A1 | 11/2005 | Schaefer | 365/227 |
| 2005/0246558 A1 | 11/2005 | Ku | |
| 2005/0249011 A1 | 11/2005 | Maeda | |
| 2005/0259504 A1 | 11/2005 | Murtugh et al. | 365/233 |
| 2005/0263312 A1 | 12/2005 | Bolken et al. | |
| 2005/0265506 A1 | 12/2005 | Foss et al. | 375/376 |
| 2005/0269715 A1 | 12/2005 | Yoo | |
| 2005/0278474 A1 | 12/2005 | Perersen et al. | 711/5 |
| 2005/0281096 A1 | 12/2005 | Bhakta et al. | |
| 2005/0281123 A1 | 12/2005 | Bell et al. | 365/230.08 |
| 2005/0283572 A1 | 12/2005 | Ishihara | |
| 2005/0285174 A1 | 12/2005 | Saito et al. | 257/296 |
| 2005/0286334 A1 | 12/2005 | Saito et al. | |
| 2005/0289292 A1 | 12/2005 | Morrow et al. | 711/105 |
| 2005/0289317 A1 | 12/2005 | Liou et al. | 711/170 |
| 2006/0002201 A1 | 1/2006 | Janzen | 365/191 |
| 2006/0010339 A1 | 1/2006 | Klein | 714/5 |

| | | | |
|---|---|---|---|
| 2006/0026484 A1 | 2/2006 | Hollums | 714/746 |
| 2006/0038597 A1 | 2/2006 | Becker et al. | |
| 2006/0039204 A1 | 2/2006 | Cornelius | |
| 2006/0039205 A1 | 2/2006 | Cornelius | 365/189.05 |
| 2006/0041711 A1 | 2/2006 | Miura et al. | 711/103 |
| 2006/0041730 A1 | 2/2006 | Larson | 711/167 |
| 2006/0044909 A1 | 3/2006 | Kinsley et al. | 365/222 |
| 2006/0044913 A1 | 3/2006 | Klein et al. | |
| 2006/0049502 A1 | 3/2006 | Goodwin et al. | |
| 2006/0050574 A1 | 3/2006 | Streif et al. | 365/194 |
| 2006/0056244 A1 | 3/2006 | Ware | 365/194 |
| 2006/0062047 A1 | 3/2006 | Bhakta et al. | |
| 2006/0067141 A1 | 3/2006 | Perego et al. | |
| 2006/0085616 A1 | 4/2006 | Zeighami et al. | 711/167 |
| 2006/0087900 A1 | 4/2006 | Bucksch et al. | |
| 2006/0090031 A1 | 4/2006 | Kirshenbaum et al. | 711/113 |
| 2006/0090054 A1 | 4/2006 | Choi et al. | 711/167 |
| 2006/0106951 A1 | 5/2006 | Bains | 710/5 |
| 2006/0112214 A1 | 5/2006 | Yeh | 711/103 |
| 2006/0112219 A1 | 5/2006 | Chawla et al. | |
| 2006/0117152 A1 | 6/2006 | Amidi et al. | 711/154 |
| 2006/0117160 A1 | 6/2006 | Jackson et al. | 711/170 |
| 2006/0118933 A1 | 6/2006 | Haba | |
| 2006/0120193 A1 | 6/2006 | Casper | |
| 2006/0123265 A1 | 6/2006 | Ruckerbauer et al. | |
| 2006/0126369 A1 | 6/2006 | Raghuram | |
| 2006/0129712 A1 | 6/2006 | Raghuram | 710/52 |
| 2006/0129740 A1 | 6/2006 | Ruckerbauer et al. | |
| 2006/0129755 A1 | 6/2006 | Raghuram | 711/105 |
| 2006/0133173 A1 | 6/2006 | Jain et al. | |
| 2006/0136791 A1 | 6/2006 | Nierle | |
| 2006/0149982 A1 | 7/2006 | Vogt | 713/320 |
| 2006/0174082 A1 | 8/2006 | Bellows et al. | |
| 2006/0176744 A1 | 8/2006 | Stave | 365/194 |
| 2006/0179262 A1 | 8/2006 | Brittain et al. | |
| 2006/0179333 A1 | 8/2006 | Brittain et al. | 713/320 |
| 2006/0179334 A1 | 8/2006 | Brittain et al. | 713/320 |
| 2006/0180926 A1 | 8/2006 | Mullen et al. | |
| 2006/0181953 A1 | 8/2006 | Rotenberg et al. | 365/230.06 |
| 2006/0195631 A1 | 8/2006 | Rajamani | |
| 2006/0198178 A1 | 9/2006 | Kinsley et al. | |
| 2006/0203590 A1 | 9/2006 | Mori et al. | |
| 2006/0206738 A1 | 9/2006 | Jeddeloh et al. | 713/320 |
| 2006/0233012 A1 | 10/2006 | Sekiguchi et al. | |
| 2006/0236165 A1 | 10/2006 | Cepulis et al. | |
| 2006/0236201 A1 | 10/2006 | Gower et al. | |
| 2006/0248261 A1 | 11/2006 | Jacob et al. | |
| 2006/0248387 A1 | 11/2006 | Nicholson et al. | 714/22 |
| 2006/0262586 A1 | 11/2006 | Solomon et al. | |
| 2006/0294295 A1 | 12/2006 | Fukuzo | 711/105 |
| 2007/0005998 A1 | 1/2007 | Jain et al. | |
| 2007/0050530 A1 | 3/2007 | Rajan | 711/5 |
| 2007/0058471 A1 | 3/2007 | Rajan et al. | 365/222 |
| 2007/0070669 A1 | 3/2007 | Tsern | |
| 2007/0088995 A1 | 4/2007 | Tsern et al. | 714/724 |
| 2007/0091696 A1 | 4/2007 | Niggemeier et al. | |
| 2007/0106860 A1 | 5/2007 | Foster, Sr. et al. | 711/170 |
| 2007/0136537 A1 | 6/2007 | Doblar et al. | |
| 2007/0162700 A1 | 7/2007 | Fortin et al. | 711/118 |
| 2007/0188997 A1 | 8/2007 | Hockanson et al. | |
| 2007/0192563 A1 | 8/2007 | Rajan et al. | 711/202 |
| 2007/0195613 A1 | 8/2007 | Rajan et al. | 365/189.05 |
| 2007/0204075 A1 | 8/2007 | Rajan et al. | |
| 2007/0216445 A1 | 9/2007 | Raghavan et al. | 326/83 |
| 2007/0247194 A1 | 10/2007 | Jain | 326/87 |
| 2007/0279084 A1 | 12/2007 | Oh et al. | |
| 2007/0288683 A1 | 12/2007 | Panabaker et al. | 711/101 |
| 2007/0288686 A1 | 12/2007 | Arcedera et al. | 711/103 |
| 2007/0288687 A1 | 12/2007 | Panabaker et al. | 711/103 |
| 2008/0002447 A1 | 1/2008 | Gulachenski et al. | |
| 2008/0010435 A1 | 1/2008 | Smith et al. | |
| 2008/0025108 A1 | 1/2008 | Rajan et al. | 365/189.05 |
| 2008/0025122 A1 | 1/2008 | Schakel et al. | 365/222 |
| 2008/0025136 A1 | 1/2008 | Rajan et al. | 365/230.08 |
| 2008/0025137 A1 | 1/2008 | Rajan et al. | 365/239 |
| 2008/0027697 A1 | 1/2008 | Rajan et al. | 703/14 |
| 2008/0027702 A1 | 1/2008 | Rajan et al. | 703/21 |
| 2008/0027703 A1 | 1/2008 | Rajan et al. | 703/21 |
| 2008/0028135 A1 | 1/2008 | Rajan et al. | |
| 2008/0028136 A1 | 1/2008 | Schakel et al. | 711/106 |
| 2008/0028137 A1 | 1/2008 | Schakel et al. | |
| 2008/0031030 A1 | 2/2008 | Rajan et al. | 365/63 |
| 2008/0031072 A1 | 2/2008 | Rajan et al. | 365/227 |
| 2008/0037353 A1 | 2/2008 | Rajan et al. | 365/227 |
| 2008/0056014 A1 | 3/2008 | Rajan et al. | 365/189.03 |
| 2008/0062773 A1 | 3/2008 | Rajan et al. | 365/189.03 |
| 2008/0065820 A1 | 3/2008 | Gillingham et al. | 711/105 |
| 2008/0082763 A1 | 4/2008 | Rajan et al. | 711/154 |
| 2008/0086588 A1 | 4/2008 | Danilak et al. | |
| 2008/0089034 A1 | 4/2008 | Hoss et al. | |
| 2008/0098277 A1 | 4/2008 | Hazelzet | |
| 2008/0103753 A1 | 5/2008 | Rajan et al. | |
| 2008/0104314 A1 | 5/2008 | Rajan et al. | |
| 2008/0109206 A1 | 5/2008 | Rajan et al. | |
| 2008/0109595 A1 | 5/2008 | Rajan et al. | |
| 2008/0109597 A1 | 5/2008 | Schakel et al. | |
| 2008/0109598 A1 | 5/2008 | Schakel et al. | |
| 2008/0115006 A1 | 5/2008 | Smith et al. | 713/601 |
| 2008/0120443 A1 | 5/2008 | Rajan et al. | |
| 2008/0120458 A1 | 5/2008 | Gillingham et al. | 711/105 |
| 2008/0123459 A1 | 5/2008 | Rajan et al. | 365/227 |
| 2008/0126624 A1 | 5/2008 | Prete et al. | |
| 2008/0126687 A1 | 5/2008 | Rajan et al. | |
| 2008/0126688 A1 | 5/2008 | Rajan et al. | |
| 2008/0126689 A1 | 5/2008 | Rajan et al. | |
| 2008/0126690 A1 | 5/2008 | Rajan et al. | 711/105 |
| 2008/0126692 A1 | 5/2008 | Rajan et al. | |
| 2008/0133825 A1 | 6/2008 | Rajan et al. | |
| 2008/0155136 A1 | 6/2008 | Hishino | |
| 2008/0159027 A1 | 7/2008 | Kim | |
| 2008/0170425 A1 | 7/2008 | Rajan | |
| 2008/0195894 A1 | 8/2008 | Schreck et al. | |
| 2008/0215832 A1 | 9/2008 | Allen et al. | |
| 2008/0239857 A1 | 10/2008 | Rajan et al. | 365/227 |
| 2008/0239858 A1 | 10/2008 | Rajan et al. | 365/227 |
| 2008/0256282 A1 | 10/2008 | Guo et al. | |
| 2009/0024789 A1 | 1/2009 | Rajan et al. | |
| 2009/0024790 A1 | 1/2009 | Rajan et al. | |
| 2009/0109613 A1 | 4/2009 | Legen et al. | |
| 2009/0216939 A1 | 8/2009 | Smith et al. | |
| 2009/0285031 A1 | 11/2009 | Rajan et al. | |
| 2009/0290442 A1 | 11/2009 | Rajan | |
| 2010/0005218 A1 | 1/2010 | Gower et al. | |
| 2010/0020585 A1 | 1/2010 | Rajan | |
| 2010/0257304 A1 | 10/2010 | Rajan et al. | |
| 2010/0271888 A1 | 10/2010 | Rajan | |
| 2010/0281280 A1 | 11/2010 | Rajan et al. | |

FOREIGN PATENT DOCUMENTS

| | | |
|---|---|---|
| DE | 102005036528 | 2/2007 |
| EP | 0644547 | 3/1995 |
| JP | 62121978 | 6/1987 |
| JP | 01171047 | 7/1989 |
| JP | 03-029357 | 2/1991 |
| JP | 03029357 | 2/1991 |
| JP | 03/276487 | 12/1991 |
| JP | 03286234 | 12/1991 |
| JP | 05-298192 | 11/1993 |
| JP | 07-141870 | 6/1995 |
| JP | 08/077097 | 3/1996 |
| JP | 08077097 | 3/1996 |
| JP | 11-149775 | 6/1999 |
| JP | 2002025255 | 1/2002 |
| JP | 3304893 B2 | 5/2002 |
| JP | 04-327474 | 11/2004 |
| JP | 2006236388 | 9/2006 |
| KR | 1020040062717 | 7/2004 |
| WO | WO 95/05676 | 2/1995 |
| WO | WO9900734 | 1/1999 |
| WO | WO02/45270 | 8/2000 |
| WO | WO01/90900 | 11/2001 |
| WO | WO01/97160 | 12/2001 |
| WO | WO2004/044754 | 5/2004 |
| WO | WO2004/051645 | 6/2004 |
| WO | WO2007002324 | 1/2007 |
| WO | WO2007/028109 | 3/2007 |

| | | |
|---|---|---|
| WO | WO 2007/038225 | 4/2007 |
| WO | WO2007/095080 | 8/2007 |
| WO | WO2008063251 | 5/2008 |

OTHER PUBLICATIONS

Preliminary Report on Patentability from PCT Application No. PCT/US06/24360 mailed on Jan. 10, 2008.
Written Opinion from International PCT Application No. PCT/US06/34390 mailed on Nov. 21, 2007.
International Search Report from PCT Application No. PCT/US06/34390 mailed on Nov. 21, 2007.
Office Action from U.S. Appl. No. 11/461,427 mailed on Sep. 5, 2008.
Final Office Action from U.S. Appl. No. 11/461,430 mailed on Sep. 8, 2008.
Notice of Allowance from U.S. Appl. No. 11/474,075 mailed on Nov. 26, 2008.
Office Action from U.S. Appl. No. 11/474,076 mailed on Nov. 3, 2008.
Office Action from U.S. Appl. No. 11/524,811 mailed on Sep. 17, 2008.
Non-final Office Action from U.S. Appl. No. 11/461,430 mailed on Feb. 19, 2009.
Final Office Action from U.S. Appl. No. 11/461,435 mailed on Jan. 28, 2009.
Non-final Office Action from U.S. Appl. No. 11/461,437 mailed on Jan. 26, 2009.
Non-final Office Action from U.S. Appl. No. 11/939,432 mailed on Feb. 6, 2009.
Wu et al., "eNVy: A Non-Volatile, Main Memory, Storage System," ASPLOS-VI Proceedings—Sixth International Conference on Architectural Support for Programming Languages and Operating Systems, San Jose, California, Oct. 4-7, 1994. SIGARCH Computer Architecture News 22(Special Issue Oct. 1994).
German Office Action From German Patent Application No. 11 2006 002 300.4-55 Mailed Jun. 5, 2009 (With Translation).
Non-Final Office Action From U.S. Appl. No. 11/461,430 Mailed Feb. 19, 2009.
Final Office Action From U.S. Appl. No. 11/461,435 Mailed Jan. 28, 2009.
Non-Final Office Action From U.S. Appl. No. 11/461,437 Mailed Jan. 26, 2009.
Non-Final Office Action From U.S. Appl. No. 11/461,441 Mailed Apr. 2, 2009.
Non-Final Office Action From U.S. Appl. No. 11/611,374 Mailed Mar. 23, 2009.
Non-Final Office Action From U.S. Appl. No. 11/762,010 Mailed Mar. 20, 2009.
Non-Final Office Action From U.S. Appl. No. 11/939,432 Mailed Feb. 6, 2009.
Non-Final Office Action From U.S. Appl. No. 12/111,819 Mailed Apr. 27, 2009.
Non-Final Office Action From U.S. Appl. No. 12/111,828 Mailed Apr. 17, 2009.
Fang et al., W. Power Complexity Analysis of Adiabatic SRAM, 6th Int. Conference on ASIC, vol. 1, Oct. 2005, pp. 334-337.
Pavan et al., P. A Complete Model of E2PROM Memory Cells for Circuit Simulations, IEEE Transactions on Computer-Aided Design of Integrated Circuits and Systems, vol. 22, No. 8, Aug. 2003, pp. 1072-1079.
German Office Action From German Patent Application No. 11 2006 001 810.8-55 Mailed Apr. 20, 2009 (With Translation).
Final Rejection From U.S. Appl. No. 11/461,437 Mailed Nov. 10, 2009.
Final Rejection from U.S. Appl. No. 11/762,010 Mailed Dec. 4, 2009.
Non-Final Rejection from U.S. Appl. No. 11/672,921 Mailed Dec. 8, 2009.
Non-Final Rejection from U.S. Appl. No. 11/672,924 Mailed Dec. 14, 2009.
Non-Final Rejection from U.S. Appl. No. 11/929,225 Mailed Dec. 14, 2009.
Non-Final Rejection from U.S. Appl. No. 11/929,261 Mailed Dec. 14, 2009.
Notice of Allowance From U.S. Appl. No. 11/611,374 Mailed Nov. 30, 2009.
Notice of Allowance From U.S. Appl. No. 12/111,819 Mailed Nov. 20, 2009.
Notice of Allowance From U.S. Appl. No. 12/111,828 Mailed Dec. 15, 2009.
Great Britain Office Action from GB Patent Application No. GB0800734.6 Mailed Mar. 1, 2010.
Final Office Action from U.S. Appl. No. 11/461,420 Mailed Apr. 28, 2010.
Notice of Allowance from U.S. Appl. No. 11/553,372 Mailed Mar. 12, 2010.
Notice of Allowance from U.S. Appl. No. 11/553,399 Mailed Mar. 22, 2010.
Non-Final Office Action from U.S. Appl. No. 11/588,739 Mailed Dec. 29, 2009.
Notice of Allowance from U.S. Appl. No. 11/611,374 Mailed Apr. 5, 2010.
Non-Final Office Action from U.S. Appl. No. 1/828,181 Mailed Mar. 2, 2010.
Non-Final Office Action from U.S. Appl. No. 11/828,182 Mailed Mar. 29, 2010.
Final Office Action from U.S. Appl. No. 11/858,518 Mailed Apr. 21, 2010.
Non-Final Office Action from U.S. Appl. No. 11/929,432 Mailed Jan. 14, 2010.
Non-Final Office Action from U.S. Appl. No. 11/929,571 Mailed Mar. 3, 2010.
Non-Final Office Action from U.S. Appl. No. 11/929,631 Mailed Mar. 3, 2010.
Non-Final Office Action from U.S. Appl. No. 11/929,636 Mailed Mar. 9, 2010.
Non-Final Office Action from U.S. Appl. No. 11/929,655 Mailed Mar. 3, 2010.
Notice of Allowance from U.S. Appl. No. 12/111,819 Mailed Mar. 10, 2010.
Non-Final Office Action from U.S. Appl. No. 12/507,682 Mailed Mar. 8, 2010.
Non-Final Office Action from U.S. Appl. No. 11/461,420 Dated Jul. 23, 2009.
Notice of Allowance from U.S. Appl. No. 11/461,430 Dated Sep. 10, 2009.
Non-Final Office Action from U.S. Appl. No. 11/461,435 Dated Aug. 5, 2009.
Non-Final Office Action from U.S. Appl. No. 11/515,167 Dated Sep. 25, 2009.
Non-Final Office Action from U.S. Appl. No. 11/515,223 Dated Sep. 22, 2009.
Non-Final Office Action from U.S. Appl. No. 11/538,041 Dated Jun. 10, 2009.
Non-Final Office Action from U.S. Appl. No. 11/553,372 Dated Jun. 25, 2009.
Notice of Allowance from U.S. Appl. No. 11/553,372 Dated Sep. 30, 2009.
Non-Final Office Action from U.S. Appl. No. 11/553,390 Dated Sep. 9, 2009.
Non-Final Office Action from U.S. Appl. No. 11/553,399 Dated Jul. 7, 2009.
Notice of Allowance from U.S. Appl. No. 11/553,399 Dated Oct. 13, 2009.
Notice of Allowance from U.S. Appl. No. 11/611,374 Dated Sep. 15, 2009.
Non-Final Office Action from U.S. Appl. No. 11/702,960 Dated Sep. 25, 2009.
Non-Final Office Action from U.S. Appl. No. 11/702,981 Dated Aug. 19, 2009.
Non-Final Office Action from U.S. Appl. No. 11/762,013 Dated Jun. 5, 2009.
Non-Final Office Action from U.S. Appl. No. 11/763,365 Dated Oct. 28, 2009.

Non-Final Office Action from U.S. Appl. No. 11/858,518 Dated Aug. 14, 2009.

Non-Final Office Action from U.S. Appl. No. 11/929,500 Dated Oct. 13, 2009.

Non-Final Office Action from U.S. Appl. No. 11/941,589 Dated Oct. 1, 2009.

Supplemental European Search Report and Search Opinion issued Sep. 21, 2009 in European Application No. 07870726.2, 8 pp.

Wu et al., "eNVy: A Non-Volatile, Main Memory Storage System", ASPLOS-VI Proceedings, Oct. 4-7, 1994, pp. 86-97.

Buffer Device for Memory Modules (DIMM), IP.com Prior Art Database, <URL: http://ip.com/IPCOM/000144850>, Feb. 10, 2007, 1 pg.

German Office Action from German Patent Application No. 11 2006 002 300.4-55 Dated May 11, 2009 (With Translation).

Great Britain Office Action from GB Patent Application No. GB0803913.3 Dated Mar. 1, 2010.

International Preliminary Examination Report From PCT Application No. PCT/US07/016385 Dated Feb. 3, 2009.

Search Report and Written Opinion From PCT Application No. PCT/US07/03460 Dated on Feb. 14, 2008.

Final Office Action from U.S. Appl. No. 11/461,435 Dated May 13, 2010.

Final Office Action from U.S. Appl. No. 11/515,167 Dated Jun. 3, 2010.

Notice of Allowance from U.S. Appl. No. 11/515,223 Dated Jul. 30, 2010.

Notice of Allowance from U.S. Appl. No. 11/553,372 Dated Aug. 4, 2010.

Final Office Action from U.S. Appl. No. 11/553,390 Dated Jun. 24, 2010.

Notice of Allowance from U.S. Appl. No. 11/553,399 Dated Dec. 3, 2010.

Notice of Allowance from U.S. Appl. No. 11/611,374 Dated Jul. 19, 2010.

Notice of Allowance from U.S. Appl. No. 11/611,374 Dated Oct. 29, 2010.

Final Office Action from U.S. Appl. No. 11/672,921 Dated Jul. 23, 2010.

Final Office Action from U.S. Appl. No. 11/672,924 Dated Sep. 7, 2010.

Final Office Action from U.S. Appl. No. 11/702,960 Dated Jun. 21, 2010.

Non-Final Office Action from U.S. Appl. No. 11/702,981 Dated Mar. 11, 2009.

Notice of Allowance from U.S. Appl. No. 11/762,010 Dated Jul. 2, 2010.

Notice of Allowance from U.S. Appl. No. 11/762,010 Dated Oct. 22, 2010.

Notice of Allowance from U.S. Appl. No. 11/762,013 Dated Aug. 17, 2010.

Notice of Allowance from U.S. Appl. No. 11/762,013 Dated Dec. 7, 2010.

Notice of Allowance from U.S. Appl. No. 11/763,365 Dated Jun. 29, 2010.

Notice of Allowance from U.S. Appl. No. 11/763,365 Dated Oct. 20, 2010.

Non-Final Office Action from U.S. Appl. No. 11/855,805 Dated Sep. 21, 2010.

Non-Final Office Action from U.S. Appl. No. 11/858,518 Dated Sep. 8, 2010.

Final Office Action from U.S. Appl. No. 11/929,225 Dated Aug. 27, 2010.

Final Office Action from U.S. Appl. No. 11/929,261 Dated Sep. 7, 2010.

Final Office Action from U.S. Appl. No. 11/929,286 Dated Aug. 20, 2010.

Notice of Allowance from U.S. Appl. No. 11/929,320 Dated Sep. 29, 2010.

Final Office Action from U.S. Appl. No. 11/929,403 Dated Aug. 31, 2010.

Final Office Action from U.S. Appl. No. 11/929,417 Dated Aug. 31, 2010.

Final Office Action from U.S. Appl. No. 11/929,432 Dated Aug. 20, 2010.

Final Office Action from U.S. Appl. No. 11/929,450 Dated Aug. 20, 2010.

Notice of Allowance from U.S. Appl. No. 11/929,483 Dated Oct. 7, 2010.

Final Office Action from U.S. Appl. No. 11/929,500 Dated Jun. 24, 2010.

Final Office Action from U.S. Appl. No. 11/929,631 Dated Nov. 18, 2010.

Final Office Action from U.S. Appl. No. 11/929,655 Dated Nov. 22, 2010.

Non-Final Office Action from U.S. Appl. No. 11/939,440 Dated Sep. 17, 2010.

Notice of Allowance from U.S. Appl. No. 11/941,589 Dated Oct. 25, 2010.

Non-Final Office Action from U.S. Appl. No. 12/057,306 Dated Oct. 8, 2010.

Non-Final Office Action from U.S. Appl. No. 12/203,100 Dated Dec. 1, 2010.

Non-Final Office Action from U.S. Appl. No. 12/574,628 Dated Jun. 10, 2010.

Non-Final Office Action from U.S. Appl. No. 12/769,428 Dated Nov. 8, 2010.

Non-Final Office Action from U.S. Appl. No. 12/838,896 Dated Sep. 3, 2010.

Search Report From PCT Application No. PCT/US10/038041 Dated Aug. 23, 2010.

Non-Final Office Action from U.S. Appl. No. 11/461,437 Dated Jan. 4, 2011.

Notice of Allowance from U.S. Appl. No. 11/515,223 Dated Feb. 4, 2011.

Non-Final Office Action from U.S. Appl. No. 11/553,372 Dated Jan. 5, 2011.

Final Office Action from U.S. Appl. No. 11/588,739 Dated Dec. 15, 2010.

Notice of Allowance from U.S. Appl. No. 11/762,010 Dated Feb. 18, 2011.

Final Office Action from U.S. Appl. No. 11/828,182 Dated Dec. 22, 2010.

Non-Final Office Action from U.S. Appl. No. 11/855,826 Dated Jan. 13, 2011.

Notice of Allowance from U.S. Appl. No. 12/144,396 Dated Feb. 1, 2011.

Non-Final Office Action from U.S. Appl. No. 12/816,756 Dated Feb. 7, 2011.

Notice of Allowance from U.S. Appl. No. 11/762,013 Dated Feb. 22, 2011.

Notice of Allowance from U.S. Appl. No. 11/929,500 Dated Feb. 24, 2011.

Notice of Allowance from U.S. Appl. No. 11/763,365 Dated Mar. 1, 2011.

Final Office Action from U.S. Appl. No. 12/574,628 Dated Mar. 3, 2011.

Final Office Action from U.S. Appl. No. 11/929,571 Dated Mar. 3, 2011.

Notice of Allowance from U.S. Appl. No. 11/611,374 Dated Mar. 4, 2011.

Notice of Allowance from U.S. Appl. No. 11/929,483 Dated Mar. 4, 2011.

Notice of Allowance from U.S. Appl. No. 11/553,399 Dated Mar. 18, 2011.

Final Office Action from U.S. Appl. No. 12/507,682 Dated Mar. 29, 2011.

Non-Final Office Action from U.S. Appl. No. 11/929,403 Dated Mar. 31, 2011.

Non-Final Office Action from U.S. Appl. No. 11/929,417 Dated Mar. 31, 2011.

Notice of Allowance from U.S. Appl. No. 12/838,896 Dated Apr. 19, 2011.

Notice of Allowance from U.S. Appl. No. 11/702,981 Dated Apr. 25, 2011.

Final Office Action from U.S. Appl. No. 11/939,440 Dated May 19, 2011.
Final Office Action from U.S. Appl. No. 11/855,805, Dated May 26, 2011.
Non-Final Office Action from U.S. Appl. No. 11/672,921 Dated May 27, 2011.
Non-Final Office Action from U.S. Appl. No. 12/378,328 Dated Jul. 15, 2011.
Final Office Action from U.S. Appl. No. 11/461,420 Dated Jul. 20, 2011.
Notice of Allowance from U.S. Appl. No. 11/461,437 Dated Jul. 25, 2011.
Notice of Allowance from U.S. Appl. No. 11/702,981 Dated Aug. 5, 2011.
Notice of Allowability from U.S. Appl. No. 11/855,826 Dated Aug. 15, 2011.
Non-Final Office Action from U.S. Appl. No. 12/574,628 Dated Sep. 20, 2011.
Non-Final Office Action from U.S. Appl. No. 11/858,518 Dated Sep. 27, 2011.
Notice of Allowance from U.S. Appl. No. 11/929,571 Dated Sep. 27, 2011.
Notice of Allowance from U.S. Appl. No. 11/929,500 Dated Sep. 27, 2011.
Notice of Allowance from U.S. Appl. No. 11/941,589 Dated Sep. 30, 2011.
Notice of Allowance from U.S. Appl. No. 12/816,756 Dated Oct. 3, 2011.
Non-Final Office Action from U.S. Appl. No. 12/508,496 Dated Oct. 11, 2011.
Notice of Allowance from U.S. Appl. No. 11/762,010 Dated Jun. 8, 2011.
Non-Final Office Action from U.S. Appl. No. 11/672,924 Dated Jun. 8, 2011.
Non-Final Office Action from U.S. Appl. No. 11/929,225 Dated Jun. 8, 2011.
Notice of Allowance from U.S. Appl. No. 11/929,500 Dated Jun. 13, 2011.
Notice of Allowance from U.S. Appl. No. 11/941,589 Dated Jun. 15, 2011.
Final Office Action from U.S. Appl. No. 12/057,306 Dated Jun. 15, 2011.
Final Office Action from U.S. Appl. No. 12/769,428 Dated Jun. 16, 2011.
Notice of Allowance from U.S. Appl. No. 12/203,100 Dated Jun. 17, 2011.
Notice of Allowance from U.S. Appl. No. 11/762,013 Dated Jun. 20, 2011.
Non-Final Office Action from U.S. Appl. No. 12/797,557 Dated Jun. 21, 2011.
Notice of Allowance from U.S. Appl. No. 11/929,483 Dated Jun. 23, 2011.
Non-Final Office Action from U.S. Appl. No. 11/702,960 Dated Jun. 23, 2011.
Non-Final Office Action from U.S. Appl. No. 11/929,655 Dated Jun. 24, 2011.
Notice of Allowance from U.S. Appl. No. 11/763,365 Dated Jun. 24, 2011.
Notice of Allowance from U.S. Appl. No. 11/611,374 Dated Jun. 24, 2011.
Non-Final Office Action from U.S. Appl. No. 11/828,182 Dated Jun. 27, 2011.
Non-Final Office Action from U.S. Appl. No. 11/828,181 Dated Jun. 27, 2011.
Non-Final Office Action from U.S. Appl. No. 11/588,739 Dated Oct. 13, 2011.
Notice of Allowance from U.S. Appl. No. 11/939,432 Dated Oct. 24, 2011.
Non-Final Office Action from U.S. Appl. No. 11/929,631 Dated Nov. 1, 2011.
Non-Final Office Action from U.S. Appl. No. 11/553,372 Dated Nov. 14, 2011.
Notice of Allowance from U.S. Appl. No. 11/515,223 Dated Nov. 29, 2011.
Notice of Allowance from U.S. Appl. No. 12/769,428 Dated Nov. 28, 2011.
Final Office Action from U.S. Appl. No. 11/939,440 Dated Dec. 12, 2011.
Notice of Allowance from U.S. Appl. No. 12/797,557 Dated Dec. 28, 2011.
Office Action, including English translation, from co-pending Japanese application No. 2008-529353, Dated Jan. 10, 2012.
Notice of Allowance from U.S. Appl. No. 12/838,896 Dated Jan. 18, 2012.
Final Office Action from U.S. Appl. No. 11/929,655 Dated Jan. 19, 2012.
Final Office Action from U.S. Appl. No. 12/378,328 Dated Feb. 3, 2012.
Final Office Action from U.S. Appl. No. 11/672,921 Dated Feb. 16, 2012.
Final Office Action from U.S. Appl. No. 11/672,924 Dated Feb. 16, 2012.
Final Office Action from U.S. Appl. No. 11/929,225 Dated Feb. 16, 2012.
International Search Report for Application No. EP12150807 Dated Feb. 16, 2012.
Final Office Action from U.S. Appl. No. 11/828,181 Dated Feb. 23, 2012.
Non-Final Office Action from U.S. Appl. No. 11/461,520 Dated Feb. 29, 2012.
Notice of Allowance from U.S. Appl. No. 12/574,628 Dated Mar. 6, 2012.
Non-Final Office Action from U.S. Appl. No. 13/276,212 Dated Mar. 15, 2012.
Non-Final Office Action from U.S. Appl. No. 13/343,612 Dated Mar. 29, 2012.
Notice of Allowance from U.S. Appl. No. 11/939,440 Dated Mar. 30, 2012.
European Search Report from co-pending European application No. 11194876.6-2212/2450798, Dated Apr. 12, 2012.
European Search Report from co-pending European application No. 11194862.6-2212/2450800, Dated Apr. 12, 2012.
Notice of Allowance from U.S. Appl. No. 11/929,636, Dated Apr. 17, 2012.
Final Office Action from U.S. Appl. No. 11/858,518, Dated Apr. 17, 2012.
European Search Report from co-pending European application No. 11194883.2-2212, Dated Apr. 27, 2012.
Non-Final Office Action from U.S. Appl. No. 11/553,372, Dated May 3, 2012.
Notice of Allowance from U.S. Appl. No. 11/929,631, Dated May 3, 2012.
Non-Final Office Action from U.S. Appl. No. 13/165,713, Dated May 22, 2012.
Non-Final Office Action from U.S. Appl. No. 12/144,396, Dated May 29, 2012.
Non-Final Office Action from U.S. Appl. No. 13/165,713, Dated May 31, 2012.
Non-Final Office Action from U.S. Appl. No. 13/280,251, Dated Jun. 12, 2012.
Final Office Action from U.S. Appl. No. 11/855,805, Dated Jun. 14, 2012.
Office Action, including English translation, from co-pending Japanese application No. 2008-52953, Dated Jul. 31, 2012.
Final Office Action from U.S. Appl. No. 13/315,933, Dated Aug. 24, 2012.
Final Office Action from U.S. Appl. No. 13/276,212, Dated Aug. 30, 2012.
Non-Final Office Action from U.S. Appl. No. 13/367,182, Dated Aug. 31, 2012.

* cited by examiner

MULTI-RANK PARTIAL WIDTH MEMORY MODULES

RELATED APPLICATIONS

The present application is a continuation of U.S. patent application Ser. No. 11/939,432, filed Nov. 13, 2007, now U.S. Pat. No. 8,130,560, which claims priority to provisional application Ser. No. 60/865,623, filed Nov. 13, 2006. The disclosures of each prior application are incorporated herein by reference.

FIELD OF THE INVENTION

The present invention relates to memory modules and more particularly to multi-rank memory modules.

BACKGROUND

The memory controller of typical computer systems communicates with memory [e.g. dynamic random access memory (DRAM)] circuits that are positioned on dual inline memory modules (DIMMs). A set of signal lines, collectively referred to as a memory bus or memory channel, is used to connect the memory controller to one or more DIMMs. The memory bus typically includes a data bus, an address bus, a control bus, and clock signals. In a parallel memory bus topology, the memory bus connects to a plurality of DIMMs in parallel.

Each DIMM in a parallel memory bus topology connects to all the data signals, all the address signals, and some or all of the control and clock signals of the memory bus. Thus, the data bus width of a DIMM matches that of the memory bus. However, the number of data I/O signals of a DRAM circuit is usually smaller than the number of data I/O signals of a DIMM. In other words, the data bus width of a DRAM circuit is smaller than the data bus width of a DIMM. Therefore, a plurality of DRAM circuits are operated in parallel to match the data widths of the individual DRAM circuits to that of the DIMM. The plurality of DRAM circuits that are controlled by a common control signal (e.g. a chip select signal) and respond in parallel to an access from the memory controller are referred to as a rank of DRAM circuits. DIMMs with one and two ranks are commonly available.

In a parallel memory bus topology, the impedance discontinuity and the bus loading caused by a DIMM affects the signal integrity of the memory bus. Consequently, as the frequency of operation of the memory bus increases, the maximum number of DIMMs that can be supported by a memory bus decreases. For example, at a 533 MHz data rate, four DIMMs per channel are feasible. However, it is expected that only two DIMMs per channel may be feasible at a 1333 MHz data rate. Thus, computer system designers are increasingly being forced to choose between memory bandwidth and memory capacity.

There is thus a need for addressing these and/or other issues associated with the prior art.

A system is provided for multi-rank, partial width memory modules. A memory controller is provided. Additionally, a memory bus is provided. Further, a memory module with a plurality of ranks of memory circuits is provided, the memory module including a first number of data pins that is less than a second number of data pins of the memory bus.

DETAILED DESCRIPTION

Figure 1A:
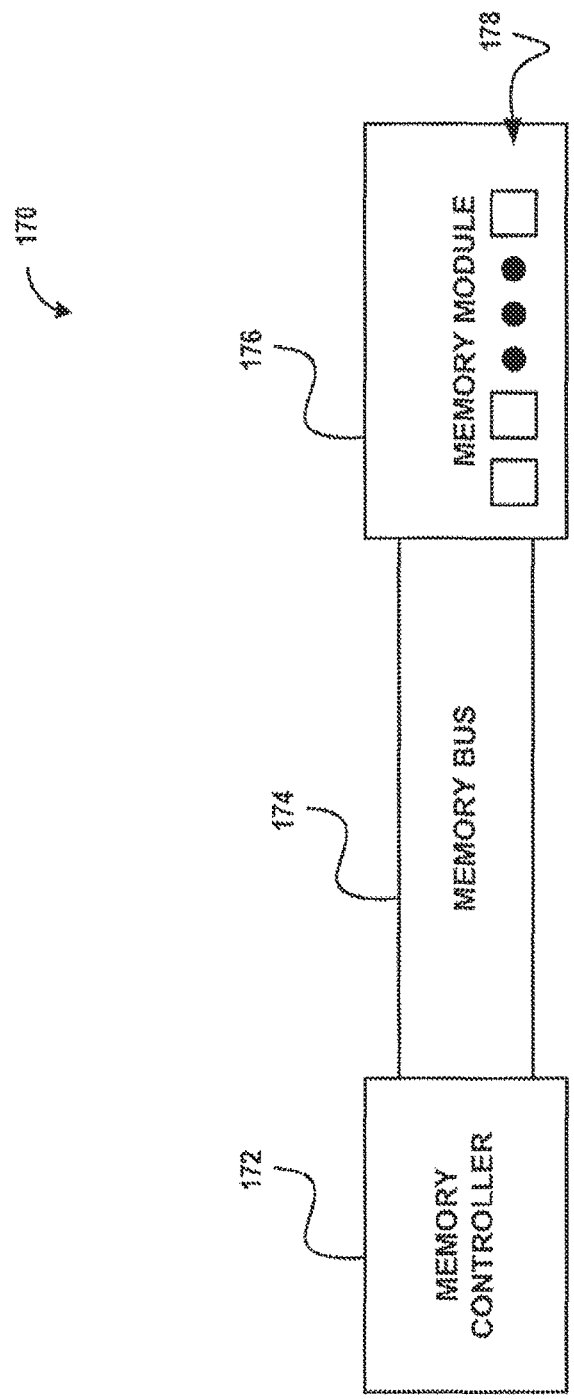
FIG. 1A shows a system for multi-rank, partial width memory modules, in accordance with one embodiment.

FIG. 1A shows a system 170 for multi-rank, partial width memory modules, in accordance with one embodiment. As shown, a memory controller 172 is provided. Additionally, a memory bus 174 is provided. Further, a memory module 176 with a plurality of ranks of memory circuits 178 is provided, the memory module 176 including a first number of data pins that is less than a second number of data pins of the memory bus.

In the context of the present description, a rank refers to at least one circuit that is controlled by a common control signal. The number of ranks of memory circuits 178 may vary. For example, in one embodiment, the memory module 176 may include at least four ranks of memory circuits 178. In another embodiment, the memory module 176 may include six ranks of memory circuits 178.

Furthermore, the first number and the second number of data pins may vary. For example, in one embodiment, the first number of data pins may be half of the second number of data pins. In another embodiment, the first number of data pins may be a third of the second number of data pins. Of course, in various embodiments the first number and the second number may be any number of data pins such that the first number of data pins is less than the second number of data pins.

In the context of the present description, a memory controller refers to any device capable of sending instructions or commands, or otherwise controlling the memory circuits 178. Additionally, in the context of the present description, a memory bus refers to any component, connection, or group of components and/or connections, used to provide electrical communication between a memory module and a memory controller. For example, in various embodiments, the memory bus 174 may include printed circuit board (PCB)

transmission lines, module connectors, component packages, sockets, and/or any other components or connections that fit the above definition.

Furthermore, the memory circuits 178 may include any type of memory device. For example, in one embodiment, the memory circuits 178 may include dynamic random access memory (DRAM). Additionally, in one embodiment, the memory module 176 may include a dual in-line memory module (DIMM).

Strictly as an option, the system 170 may include at least one buffer chip (not shown) that is in communication with the memory circuits 178 and the memory bus 174. In one embodiment, the buffer chip may be utilized to transform data signals associated with the memory bus 174. For example, the data signals may be transformed from a first data rate to a second data rate which is two times the first data rate.

Additionally, data in the data signals may be transformed from a first data width to a second data width which is half of the first data width. In one embodiment, the data signals may be associated with data transmission lines included in the memory bus 174. In this case, the memory module 176 may be connected only some of a plurality of the data transmission lines corresponding to the memory bus. In another embodiment, the memory module 176 may be configured to connect to all of the data transmission lines corresponding to the memory bus.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 1B:
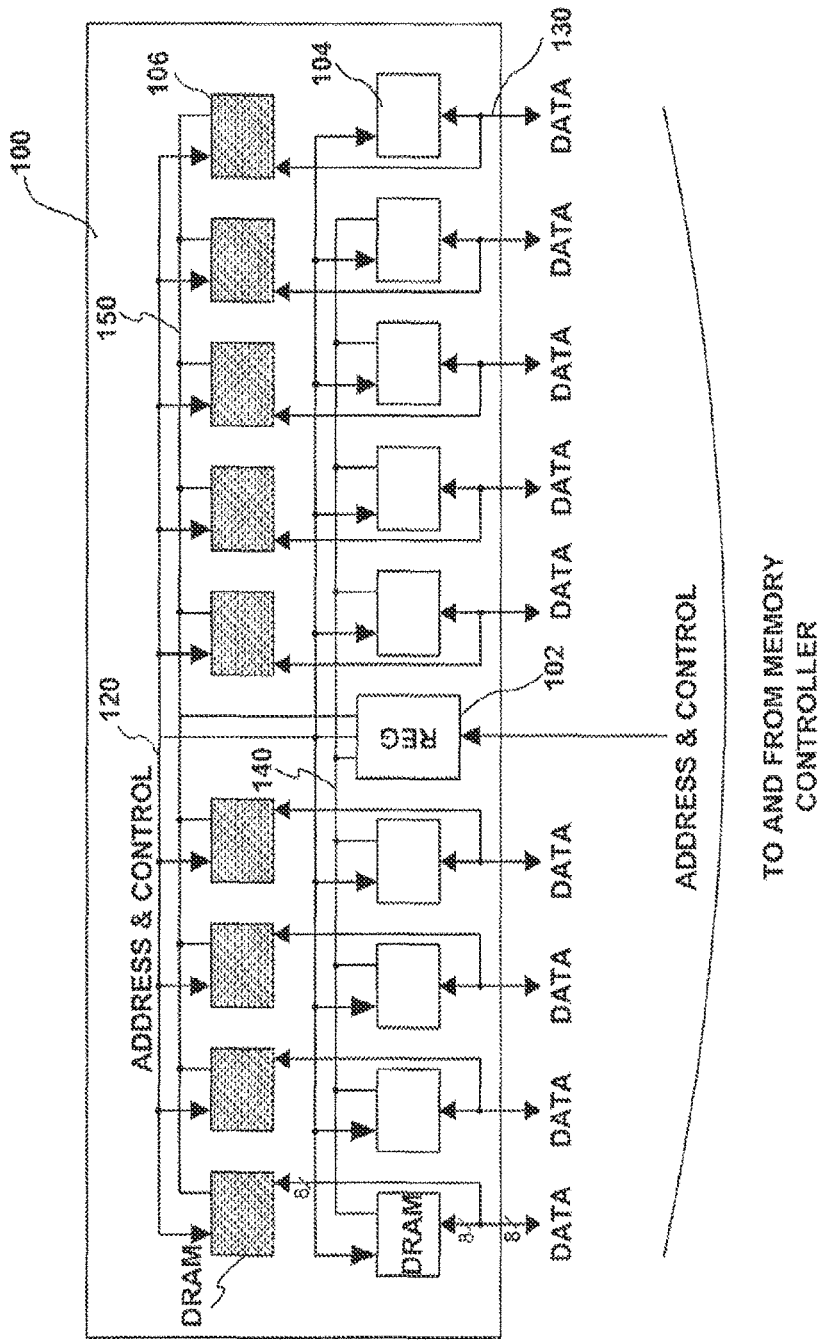
FIG. 1B illustrates a two-rank registered dual inline memory module (R-DIMM) built with 8-bit wide (x8) memory circuits, in accordance with Joint Electron Device Engineering Council (JEDEC) specifications.

FIG. 1B illustrates a two-rank registered DIMM (R-DIMM) 100 built with 8-bit wide (x8) memory (e.g. DRAM, etc.) circuits in accordance with Joint Electron Device Engineering Council (JEDEC) specifications. It should be noted that the aforementioned definitions may apply during the present description.

As shown, included are a register chip 102, and a plurality of DRAM circuits 104 and 106. The DRAM circuits 104 are positioned on one side of the R-DIMM 100 while the DRAM circuits 106 are positioned on the opposite side of the R-DIMM 100. The R-DIMM 100 may be in communication with a memory controller of an electronic host system as shown. In various embodiments, such system may be in the form of a desktop computer, a lap-top computer, a server, a storage system, a networking system, a workstation, a personal digital assistant (PDA), a mobile phone, a television, a computer peripheral (e.g. printer, etc.), a consumer electronics system, a communication system, and/or any other software and/or hardware, for that matter.

The DRAM circuits 104 belong to a first rank and are controlled by a common first chip select signal 140. The DRAM circuits 106 belong to a second rank and are controlled by a common second chip select signal 150. The memory controller may access the first rank by placing an address and command on the address and control lines 120 and asserting the first chip select signal 140.

Optionally, data may then be transferred between the memory controller and the DRAM circuits 104 of the first rank over the data signals 130. The data signals 130 represent all the data signals in the memory bus, and the DRAM circuits 104 connect to all of the data signals 130. In this case, the DRAM circuits 104 may provide all the data signals requested by the memory controller during a read operation to the first rank, and accept all the data signals provided by the memory controller during a write operation to the first rank. For example, the memory bus may have 72 data signals, in which case, each rank on a standard R-DIMM may have nine x8 DRAM circuits.

The memory controller may also access the second rank by placing an address and command on the address and control lines 120 and asserting the second chip select signal 150. Optionally, data may then be transferred between the memory controller and the DRAM circuits 106 of the second rank over the data signals 130. The data signals 130 represent all the data signals in the memory bus, and the DRAM circuits 106 connect to all of the data signals 130. In this case, the DRAM circuits 106 may provide all the data signals requested by the memory controller during a read operation to the second rank, and accept all the data signals provided by the memory controller during a write operation to the second rank.

Figure 2:
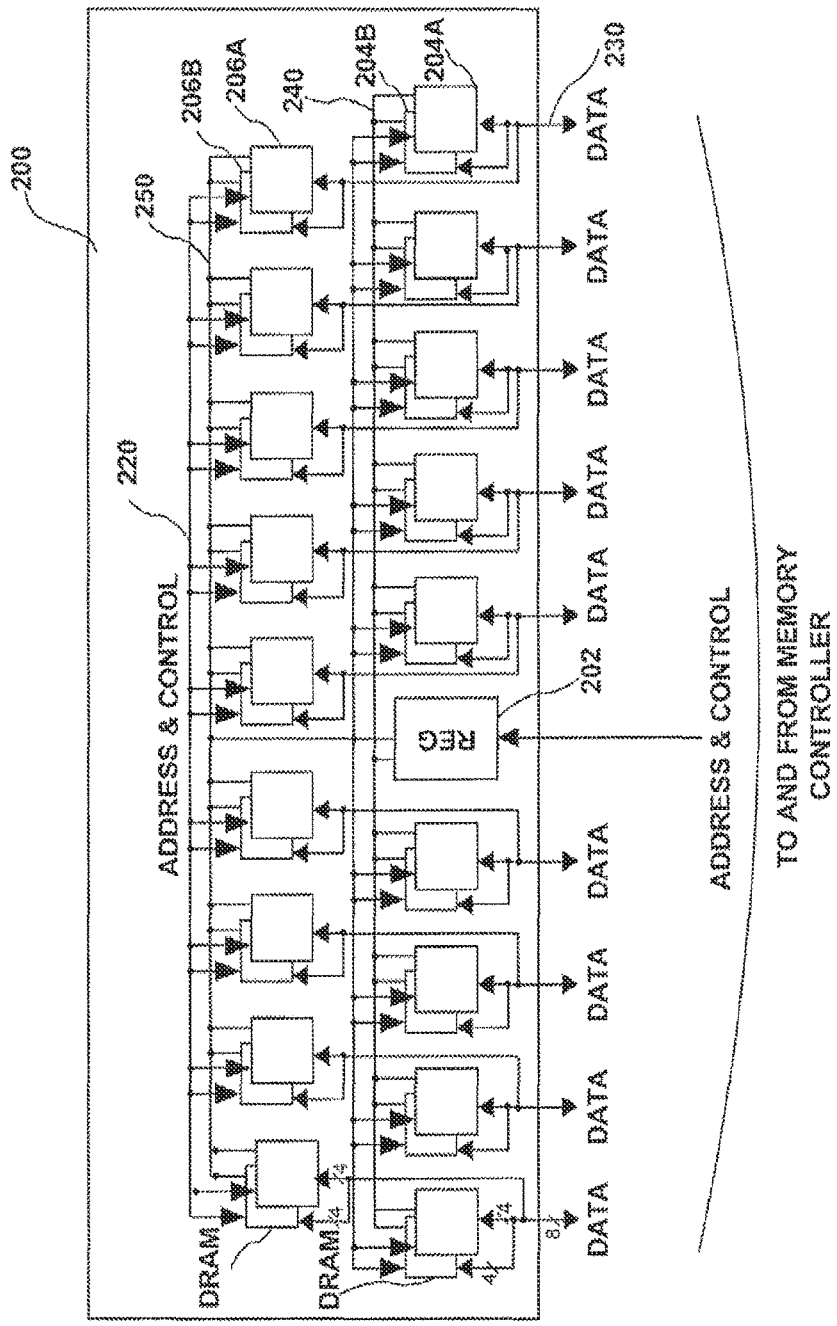
FIG. 2 illustrates a two-rank R-DIMM built with 4-bit wide (x4) dynamic random access memory (DRAM) circuits, in accordance with JEDEC specifications.

FIG. 2 illustrates a two-rank registered DIMM (R-DIMM) 200 built with 4-bit wide (x4) DRAM circuits in accordance with JEDEC specifications. Again, the aforementioned definitions may apply during the present description.

As shown, included are a register chip 202, and a plurality of DRAM circuits 204A, 204B, 206A, and 206B. The R-DIMM 200 may be in communication with a memory controller of an electronic host system as shown. The DRAM circuits 204A and 204B belong to a first rank and are controlled by a common first chip select signal 240.

In some embodiments, the DRAM circuits 2044 may be positioned on one side of the R-DIMM 200 while the DRAM circuits 204B are positioned on the opposite side of the R-DIMM 200. The DRAM circuits 206A and 206B belong to a second rank and are controlled by a common second chip select signal 250. In some embodiments, the DRAM circuits 206A may be positioned on one side of the R-DIMM 200 while the DRAM circuits 206B are positioned on the opposite side of the R-DIMM 200.

In various embodiments, the DRAM circuits 204A and 206A may be stacked on top of each other, or placed next to each other on the same side of a DIMM PCB, or placed on opposite sides of the DIMM PCB in a clamshell-type arrangement. Similarly, the DRAM circuits 204B and 206B may be stacked on top of each other, or placed next to each other on the same side of the DIMM PCB, or placed on opposite sides of the board in a clamshell-type arrangement.

The memory controller may access the first rank by placing an address and command on address and control lines 220 and asserting a first chip select signal 240. Optionally, data may then be transferred between the memory controller and the DRAM circuits 204A and 204B of the first rank over the data signals 230. In this case, the data signals 230 represent all the data signals in the memory bus, and the DRAM circuits 204A and 204B connect to all of the data signals 230.

The memory controller may also access the second rank by placing an address and command on the address and control lines 220 and asserting a second chip select signal 250. Optionally, data may then be transferred between the memory controller and the DRAM circuits 206A and 206B of the second rank over the data signals 230. In this case, the data signals 230 represent all the data signals in the memory bus, and the DRAM circuits 206A and 206B connect to all of the data signals in the memory bus. For example, if the memory bus has 72 data signals, each rank of a standard R-DIMM will have eighteen x4 DRAM circuits.

Figure 3:
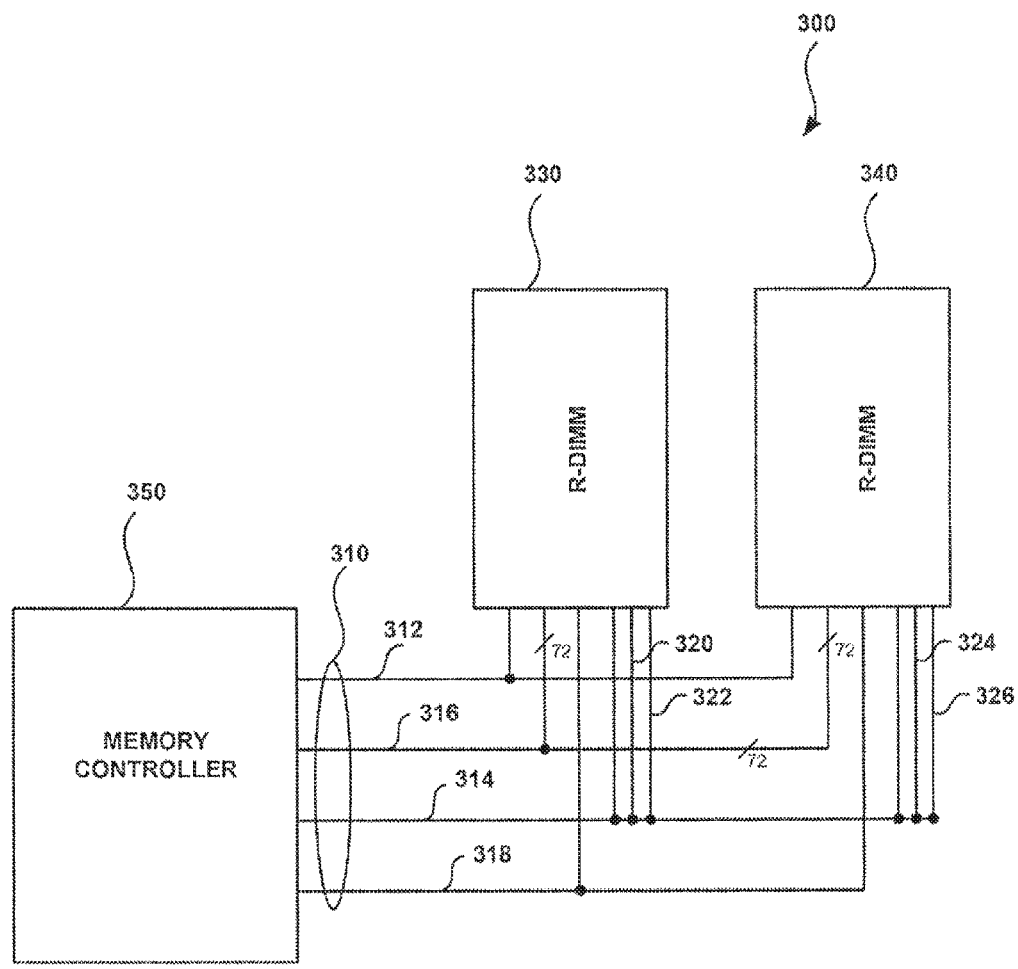
FIG. 3 illustrates an electronic host system that includes a memory controller, and two standard R-DIMMs.

FIG. 3 illustrates an electronic host system 300 that includes a memory controller 350, and two standard R-DIMMs 330 and 340. Additionally, the aforementioned definitions may apply during the present description.

As shown, a parallel memory bus 310 connects the memory controller 350 to the two standard R-DIMMs 330 and 340, each of which is a two rank DIMM. The memory bus 310 includes an address bus 312, a control bus 314, a data bus 316, and clock signals 318. All the signals in the address bus 312 and the data bus 316 connect to both of the R-DIMMs 330 and 340 while some, but not all, of the signals in the control bus 314 connect to of the R-DIMMs 330 and 340.

The control bus 314 includes a plurality of chip select signals. The first two of these signals, 320 and 322, connect to the first R-DIMM 330, while the third and fourth chip select signals, 324 and 326, connect to the second R-DIMM 340. Thus, when the memory controller 350 accesses the first rank of DRAM circuits, it asserts chip select signal 320 and the corresponding DRAM circuits on the R-DIMM 330 respond to the access. Similarly, when the memory controller 350 wishes to access the third rank of DRAM circuits, it asserts chip select signal 324 and the corresponding DRAM circuits on the R-DIMM 340 respond to the access. In other words, each memory access involves DRAM circuits on only one R-DIMM.

However, both of the R-DIMMs 330 and 340 connect to the data bus 316 in parallel. Thus, any given access involves one source and two loads. For example, when the memory controller 350 writes data to a rank of DRAM circuits on the first R-DIMM 330, both of the R-DIMMs 330 and 340 appear as loads to the memory controller 350. Similarly, when a rank of DRAM circuits on the first R-DIMM 330 return data (e.g. in a read access) to the memory controller 350, both the memory controller 350 and the second R-DIMM 340 appear as loads to the DRAM circuits on the first R-DIMM 330 that are driving the data bus 316. Topologies that involve a source and multiple loads are typically capable of operating at lower speeds than point-to-point topologies that have one source and one load.

Figure 4:
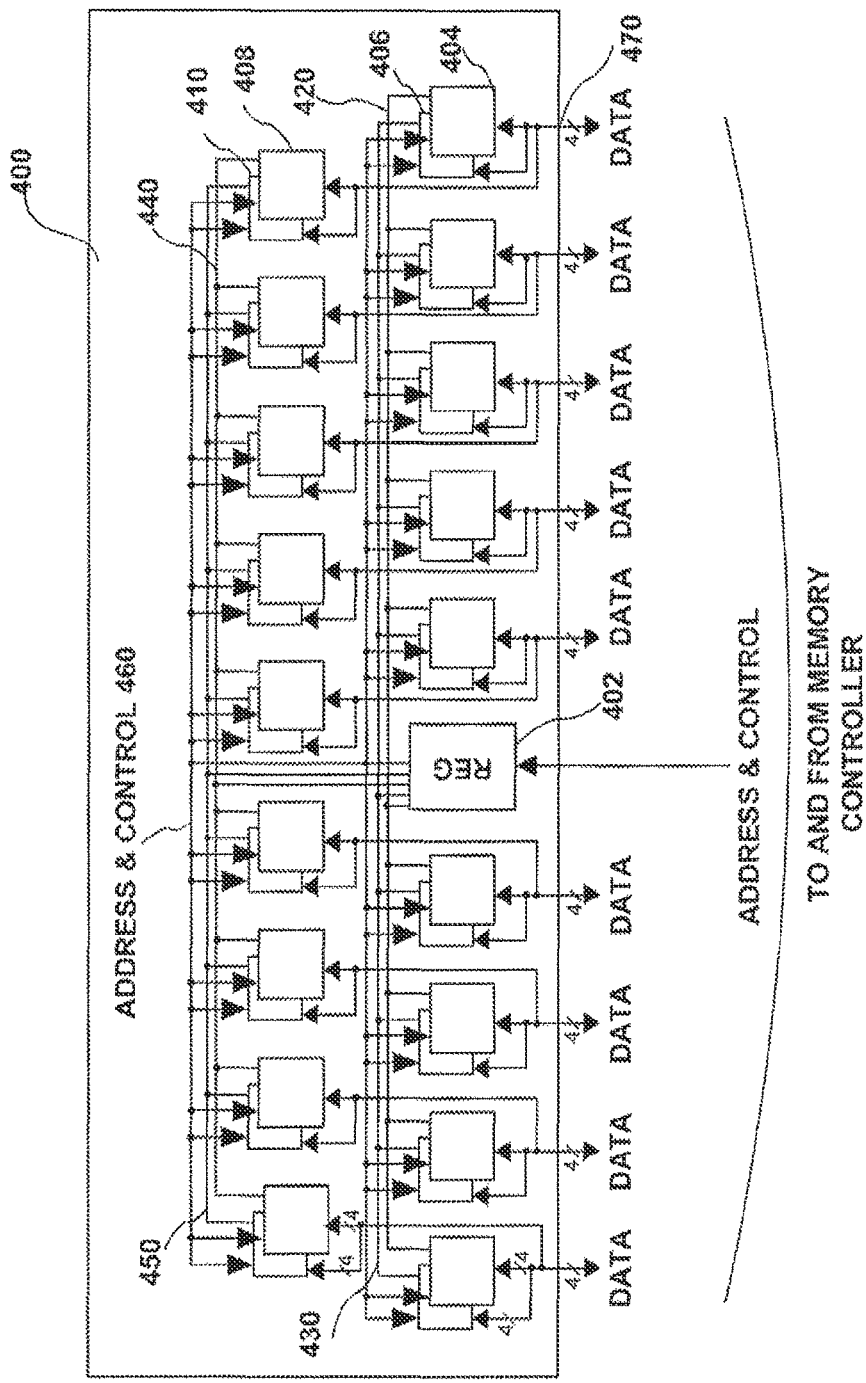
FIG. 4 illustrates a four-rank, half-width R-DIMM built using x4 DRAM circuits, in accordance with one embodiment.

FIG. 4 illustrates a four-rank, half-width R-DIMM 400 built using x4 DRAM circuits, in accordance with one embodiment. As an option, the R-DIMM 400 may be implemented in the context of the details of FIGS. 1-3. Of course, however, the R-DIMM 400 may be implemented in any desired environment. Again, the aforementioned definitions may apply during the present description.

As shown, included are a register chip 402, and a plurality of DRAM circuits 404, 406, 408, and 410. The DRAM circuits 404 belong to the first rank and are controlled by a common chip select signal 420. Similarly, the DRAM circuits 406 belong to the second rank and are controlled by a chip select signal 430. The DRAM circuits 408 belong to the third rank and are controlled by a chip select signal 440, while the DRAM circuits 410 belong to the fourth rank and are controlled by a chip select signal 450.

In this case, the DRAM circuits 404, 406, 408, and 410 are all x4 DRAM circuits, and are grouped into nine sets of DRAM circuits. Each set contains one DRAM circuit from each of the four ranks. The data pins of the DRAM circuits in a set are connected to each other and to four data pins 470 of the R-DIMM 400. Since there are nine such sets, the R-DIMM 400 may connect to 36 data signals of a memory bus. In the case where a typical memory bus has 72 data signals, the R-DIMM 400 is a halts-width DIMM with four ranks of DRAM circuits.

Figure 5:
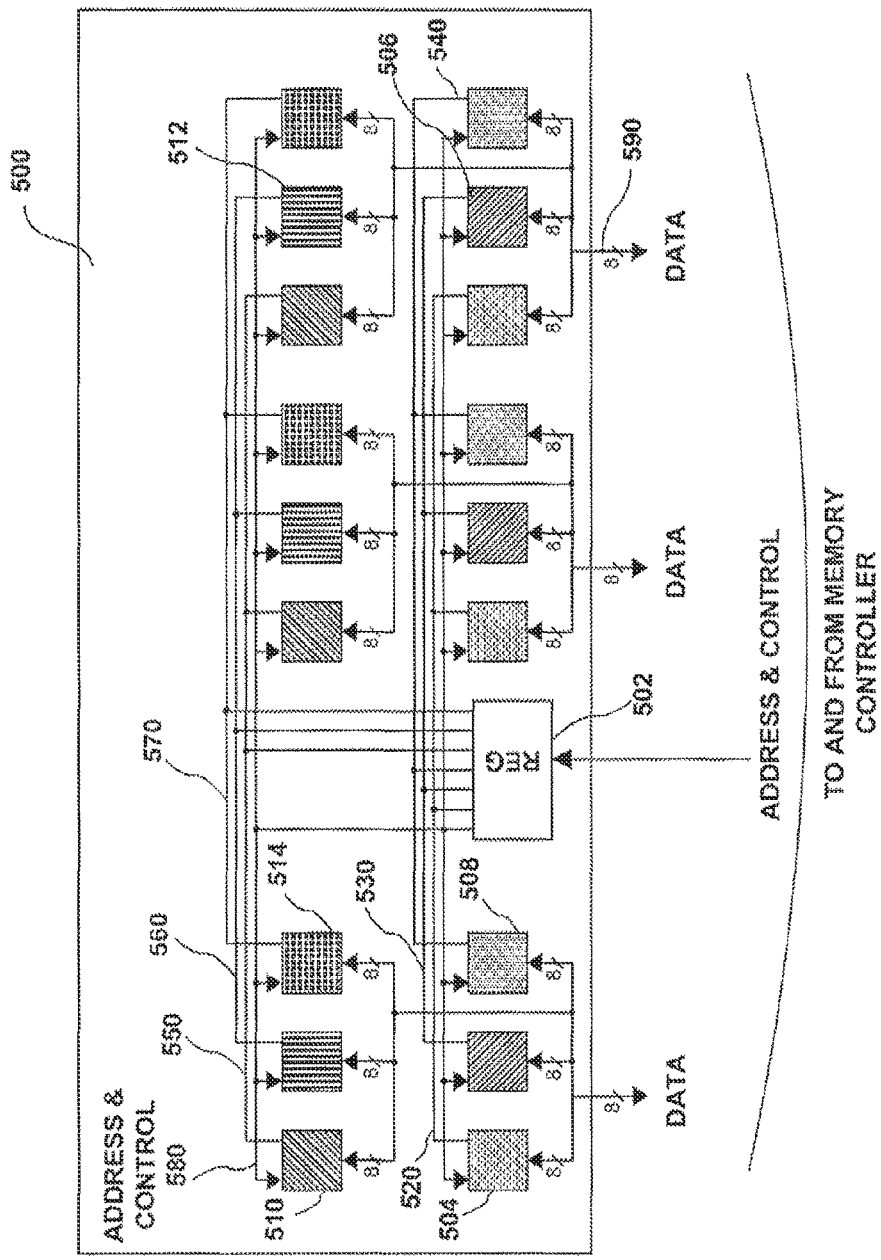
FIG. 5 illustrates a six-rank, one-third width R-DIMM built using x8 DRAM circuits, in accordance with another embodiment.

FIG. 5 illustrates a six-rank, one-third width R-DIMM 500 built using x8 DRAM circuits, in accordance with another embodiment. As an option, the R-DIMM 500 may be implemented in the context of the details of FIGS. 1-4. Of course, however, the R-DIMM 500 may be implemented in any desired environment. Additionally, the aforementioned definitions may apply during the present description.

As shown, included are a register chip 502, and a plurality of DRAM circuits 504, 506, 508, 510, 512, and 514. The DRAM circuits 504 belong to the first rank and are controlled by a common chip select signal 520. Similarly, the DRAM circuits 506 belong to the second rank and are controlled by a chip select signal 530. The DRAM circuits 508 belong to the third rank and are controlled by a chip select signal 540, while the DRAM circuits 510 belong to the fourth rank and are controlled by a chip select signal 550. The DRAM circuits 512 belong to the fifth rank and are controlled by a chip select signal 560. The DRAM circuits 514 belong to the sixth rank and are controlled by a chip select signal 570.

In this case, the DRAM circuits 504, 506, 508, 510, 512, and 514 are all x8 DRAM circuits, and are grouped into three sets of DRAM circuits. Each set contains one DRAM circuit from each of the six ranks. The data pins of the DRAM circuits in a set are connected to each other and to eight data pins 590 of the R-DIMM 500. Since there are three such sets, the R-DIMM 500 may connect to 24 data signals of a memory bus. In the case where a typical memory bus has 72 data signals, the R-DIMM 500 is a one-third width DIMM with six ranks of DRAM circuits.

Figure 6:
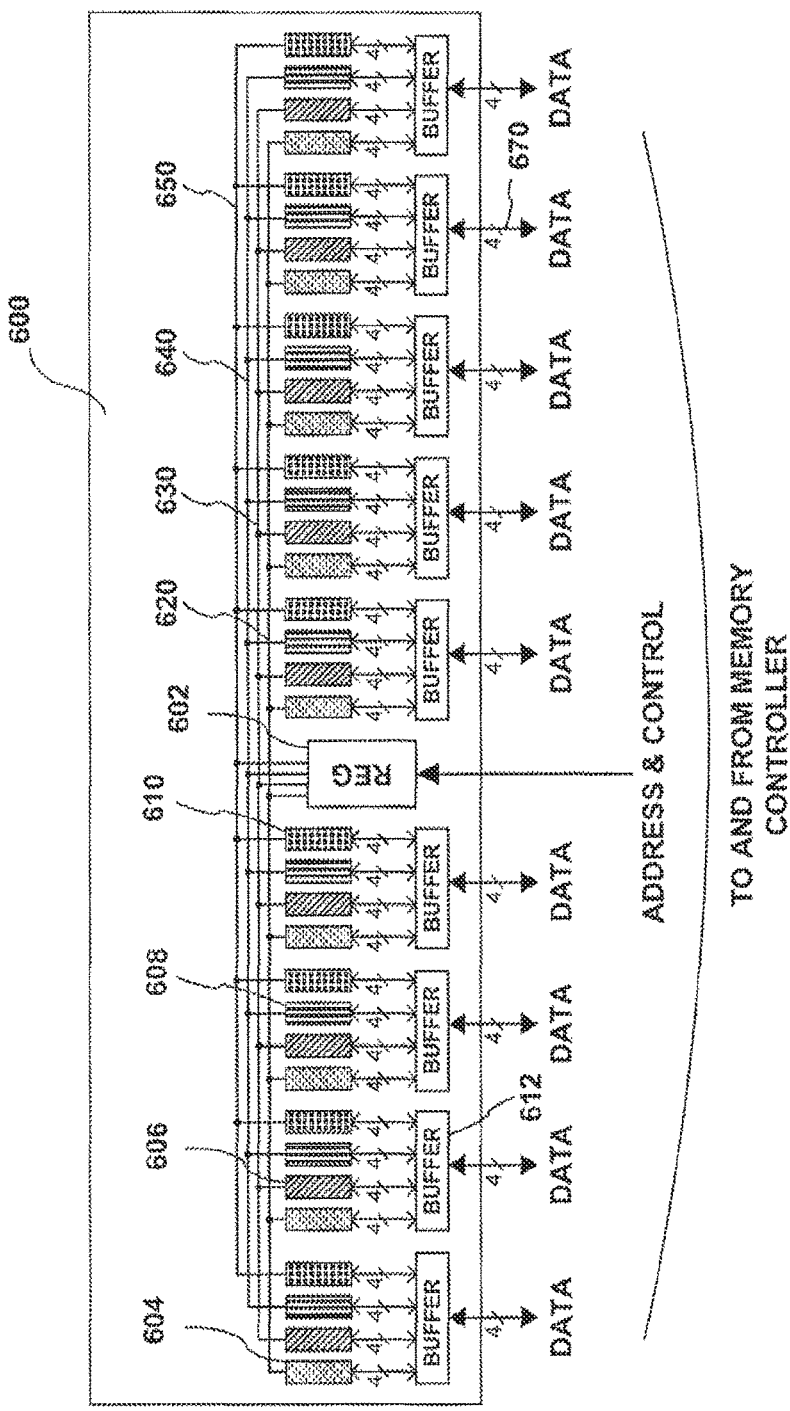
FIG. 6 illustrates a four-rank, half-width R-DIMM built using x4 DRAM circuits and buffer circuits, in accordance with yet another embodiment.

FIG. 6 illustrates a four-rank, half-width R-DIMM 600 built using x4 DRAM circuits and buffer circuits, in accordance with yet another embodiment. As an option, the R-DIMM 600 may be implemented in the context of the details of FIGS. 1-5. Of course, however, the R-DIMM 600 may be implemented in any desired environment. Again, the aforementioned definitions may apply during the present description.

As shown, included are a register chip 602, a plurality of DRAM circuits 604, 606, 608, and 610, and buffer circuits 612. The DRAM circuits 604 belong to the first rank and are controlled by a common chip select signal 620. Similarly, the DRAM circuits 606 belong to the second rank and are controlled by a chip select signal 630. The DRAM circuits 608 belong to the third rank and are controlled by a chip select signal 640. While the DRAM circuits 610 belong to the fourth rank and are controlled by a chip select signal 650.

In this case, the DRAM circuits 604, 606, 608, and 610 are all x4 DRAM circuits, and are grouped into nine sets of DRAM circuits. Each set contains one DRAM circuit from each of the four ranks, and in one embodiment, the buffer chip 612. The data pins of the DRAM circuits 604, 606, 608, and 610 in a set are connected to a first set of pins of the buffer chip 612, while a second set of pins of the buffer chip 612 are connected to four data pins 670 of the R-DIMM 600. The buffer chip 612 reduces the loading of the multiple ranks of DRAM circuits on the data bus since each data pin of the R-DIMM 600 connects to only one pin of a buffer chip instead of the corresponding data pin of four DRAM circuits.

Since there are nine such sets, the R-DIMM 600 may connect to 36 data signals of a memory bus. Since a typical memory bus has 72 data signals, the R-DIMM 600 is thus a half-width DIMM with four ranks of DRAM circuits. In some embodiments, each of the DRAM circuit 604, 606, 608, and 610 may be a plurality of DRAM circuits that are emulated by the buffer chip to appear as a higher capacity virtual DRAM circuit to the memory controller with at least one aspect that is different from that of the plurality of DRAM circuits.

In different embodiments, such aspect may include, for example, a number, a signal, a memory capacity, a timing, a latency, a design parameter, a logical interface, a control system, a property, a behavior (e.g. power behavior), and/or any other aspect, for that matter. Such embodiments may, for example, enable higher capacity, multi-rank, partial width DIMMs. For the sake of simplicity, the address and control signals on the R-DIMM 600 are not shown in FIG. 6.

Figure 7:
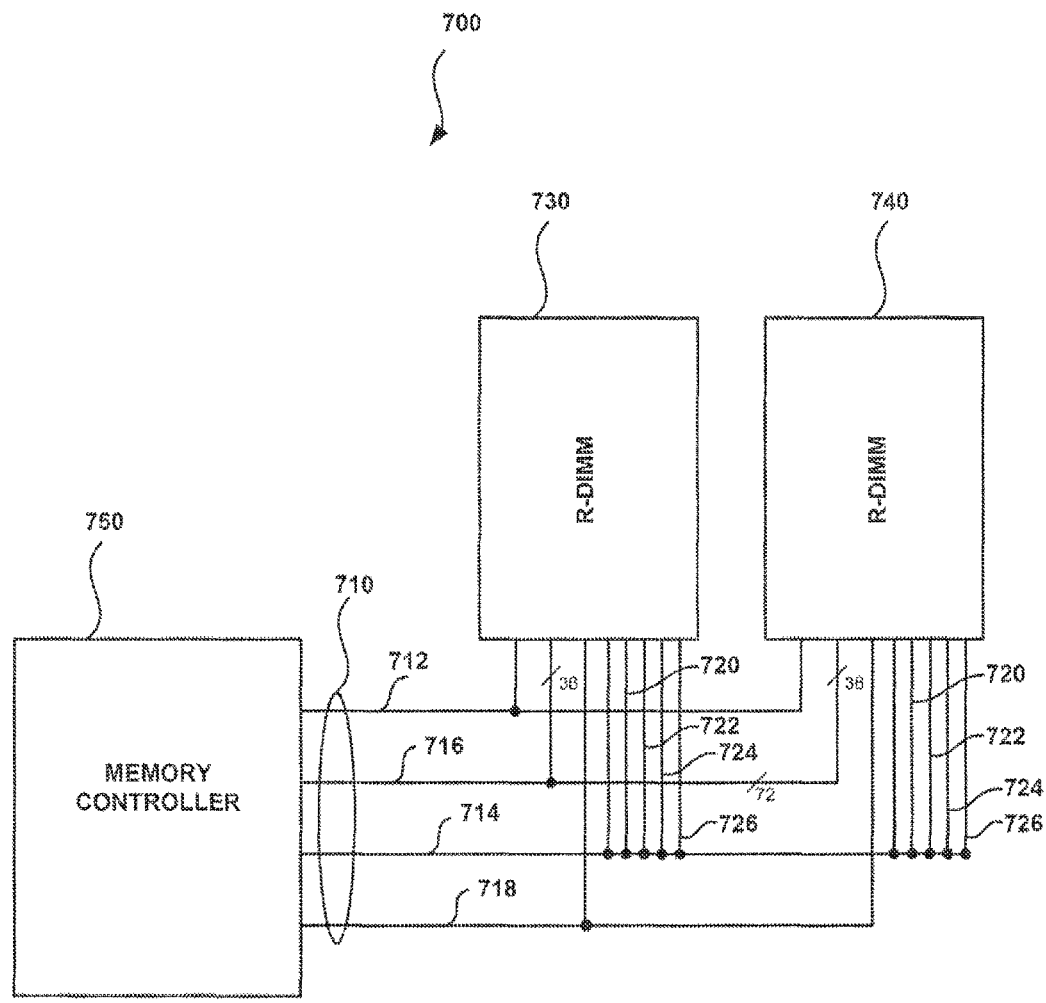
FIG. 7 illustrates an electronic host system that includes a memory controller, and two half width R-DIMMs, in accordance with another embodiment.

FIG. 7 illustrates an electronic host system 700 that includes a memory controller 750, and two half width R-DIMMs 730 and 740, in accordance with another embodiment. As an option, the electronic host system 700 may be implemented in the context of the details of FIGS. 1-6. Of course, however, the electronic host system 700 may be implemented in any desired environment. Additionally, the aforementioned definitions may apply during the present description.

As shown, a parallel memory bus 710 connects the memory controller 750 to the two half width R-DIMMs 730 and 740, each of which is a four-rank DIMM. The memory bus includes an address bus 712, a control bus 714, a data bus 116, and clock signals 718. All the signals in the address bus 712 connect to both of the R-DIMMs 730 and 740 while only half the signals in the data bus 716 connect to each R-DIMM 730 and 740. The control bus 714 includes a plurality of chip select signals.

The chip select signals corresponding to the four ranks in the system, 720, 722, 724, and 726, connect to the R-DIMM 730 and to the R-DIMM 740. Thus, when the memory controller 750 accesses the first rank of DRAM circuits, it asserts the chip select signal 720 and the corresponding DRAM circuits on the R-DIMM 730 and on the R-DIMM 740 respond to the access. For example, when the memory controller 750 performs a read access to the first rank of DRAM circuits, half the data signals are driven by DRAM circuits on the R-DIMM 730 while the other half of the data signals are driven by DRAM circuits on the R-DIMM 740.

Similarly, when the memory controller 750 wishes to access the third rank of DRAM circuits, it asserts the chip select signal 724 and the corresponding DRAM circuits on the R-DIMM 730 and the R-DIMM 740 respond to the access. In other words, each memory access involves DRAM circuits on both the R-DIMM 730 and the R-DIMM 740. Such an arrangement transforms each of the data signals in the data bus 716 into a point-to-point signal between the memory controller 750 and one R-DIMM.

It should be noted that partial width DIMMs may be compatible with systems that are configured with traditional parallel memory bus topologies. In other words, all the data signals in the data bus 716 may be connected to the connectors of both DIMMs. However, when partial width DIMMs are used, the memory circuits on each DIMM connect to only half the data signals in the data bus.

In such systems, some of the data signals in the data bus 716 may be point-to-point nets (i.e. without stubs) while other signals in the data bus 716 may have stubs. To illustrate, assume that all the signals in data bus 716 connect to the connectors of R-DIMM 730 and R-DIMM 740. When two half-width R-DIMMs are inserted into these connectors, the data signals in the data bus 716 that are driven by the DRAM circuits on the R-DIMM 740 are point-to-point nets since the memory controller 750 and the DRAM circuits on the R-DIMM 740 are located at either ends of the nets.

However, the data signals that are driven by the DRAM circuits on the R-DIMM 730 may have stubs since the DRAM circuits on the R-DIMM 730 are not located at one end of the nets. The stubs correspond to the segments of the nets between the two connectors. In some embodiments, the data signals in the data bus 716 that are driven by the DRAM circuits on the R-DIMM 730 may be terminated at the far end of the bus away from the memory controller 750. These termination resistors may be located on the motherboard, or on the R-DIMM 740, or in another suitable place.

Moreover, the data signals that are driven by the DRAM circuits on the R-DIMM 740 may also be similarly terminated in other embodiments. Of course, it is also possible to design a system that works exclusively with partial width DIMMs, in which case, each data signal in the data bus 716 connects to only one DIMM connector on the memory bus 710.

Figure 8:
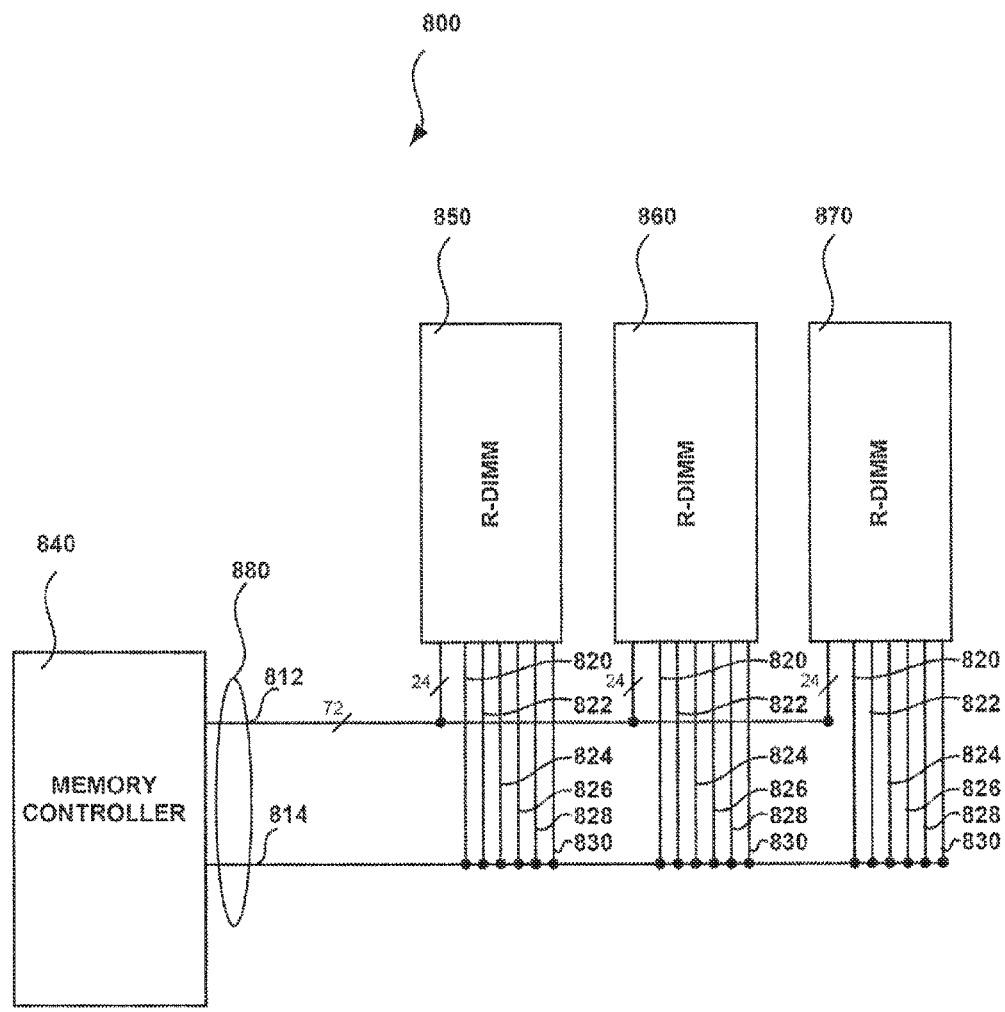
FIG. 8 illustrates an electronic host system that includes a memory controller, and three one-third width R-DIMMs, in accordance with another embodiment.

FIG. 8 illustrates an electronic host system 800 that includes a memory controller 840, and three one-third width R-DIMMs 850, 860, and 870, in accordance with another embodiment. As an option, the electronic host system 800 may be implemented in the context of the details of FIGS. 1-7. Of course, however, the electronic host system 800 may be implemented in any desired environment. Still yet, the aforementioned definitions may apply during the present description.

As shown, a parallel memory bus 880 connects the memory controller 840 to the three one-third width R-DIMMs 850, 860, and 870, each of which is a six-rank DIMM. The memory bus 880 includes an address but (not shown), a control bus 814, a data bus 812, and clock signals (not shown). All the signals in the address bus connect to all three R-DIMMs while only one-third of the signals in the data bus 812 connect to each of the R-DIMMs 850, 860, and 870.

The control bus 814 includes a plurality of chip select signals. The chip select signals corresponding to the six ranks in the system, 820, 822, 824, 826, 828, and 830, connect to all three of the R-DIMMs 850, 860, and 870. Thus, when the memory controller 840 accesses the first rank of DRAM circuits, it asserts the chip select signal 820 and the corresponding DRAM circuits on the R-DIMM 850, on the R-DIMM 860, and on the R-DIMM 870 respond to the access.

For example, when the memory controller 840 performs a read access to the first rank of DRAM circuits, one-third of the data signals are driven by DRAM circuits on the R-DIMM 850, another one-third of the data signals are driven by DRAM circuits on the R-DIMM 860, and the remaining one-third of the data signals are driven by DRAM circuits on the R-DIMM 870. In other words, each memory access involves DRAM circuits on all three of the R-DIMMs 850, 860, and 870. Such an arrangement transforms each of the data signals in the data bus 812 into a point-to-point signal between the memory controller 840 and one R-DIMM.

In various embodiments, partial-rank, partial width, memory modules may be provided, wherein each DIMM corresponds to a part of all of the ranks in the memory bus. In other words, each DIMM connects to some but not all of the data signals in a memory bus for all of the ranks in the channel. For example, in a DDR2 memory bus with two R-DIMM slots, each R-DIMM may have two ranks and connect to all 72 data signals in the channel. Therefore, each data signal in the memory bus is connected to the memory controller and the two R-DIMMs.

For the case of the same memory bus with two multi-rank, partial width R-DIMMs, each R-DIMM may have four ranks but the first R-DIMM may connect to 36 data signals in the channel while the second R-DIMM may connect to the other 36 data signals in the channel. Thus, each of the data signal in the memory bus becomes a point-to-point connection between the memory controller and one R-DIMM, which reduces signal integrity issues and increases the maximum frequency of operation of the channel. In other embodiments, full-rank, partial width, memory modules may be built that correspond to one or more complete ranks but connect to some but not all of the data signals in the memory bus.

Figure 9:
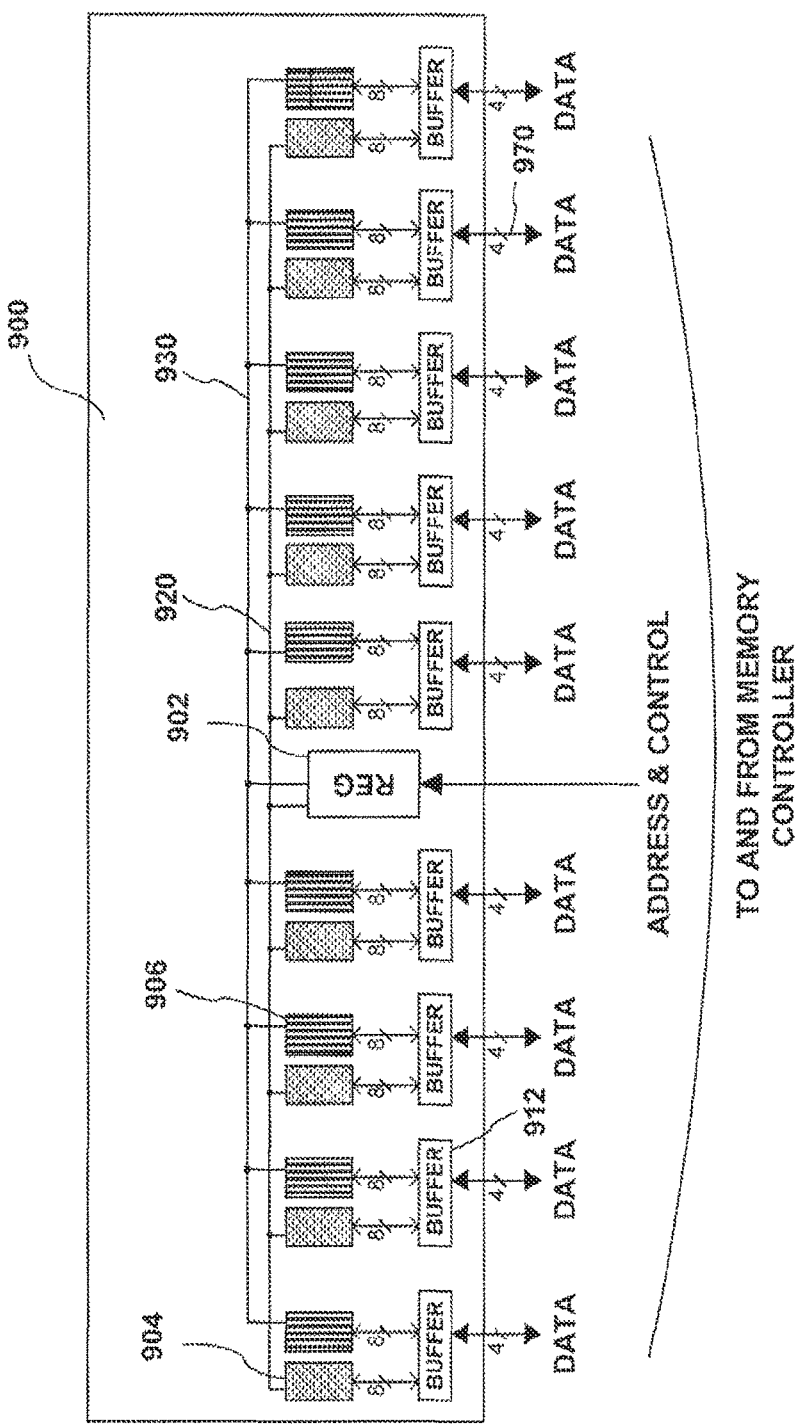
FIG. 9 illustrates a two-full-rank, half-width R-DIMM built using x8 DRAM circuits and buffer circuits, in accordance with one embodiment.

FIG. 9 illustrates a two-full-rank, half-width R-DIMM 900 built using x8 DRAM circuits and buffer circuits, in accordance with one embodiment. As an option, the R-DIMM 900 may be implemented in the context of the details of FIGS. 1-8. Of course, however, the R-DIMM 900 may be implemented in any desired environment. Again, the aforementioned definitions may apply during the present description.

As shown, included are a register chip 902, a plurality of DRAM circuits 904 and 906, and buffer circuits 912. The DRAM circuits 904 belong to the first rank and are controlled by a common chip select signal 920. Similarly, the DRAM circuits 906 belong to the second rank and are controlled by chip select signal 930.

The DRAM circuits 904 and 906 are all illustrated as x8 DRAM circuits, and are grouped into nine sets of DRAM circuits. Each set contains one DRAM circuit from each of the two ranks, and in one embodiment, the buffer chip 912. The eight data pins of each of the DRAM circuits in a set are connected to a first set of pins of the buffer chip 912, while a second set of pins of the buffer chip 912 are connected to four data pins 970 of the R-DIMM 900. The buffer chip 912 acts to transform the eight data signals from each DRAM circuit operating at a specific data rate to four data signals that operate at twice the data rate and connect to the data pins of the R-DIMM, and vice versa. Since there are nine such sets, the R-DIMM 900 may connect to 36 data signals of a memory bus.

In the case that a typical memory bus has 72 data signals, the R-DIMM 900 is a half-width DIMM with two full ranks of DRAM circuits. In some embodiments, each DRAM circuit 904 and 906 may be a plurality of DRAM circuits that are emulated by the buffer chip to appear as a higher capacity virtual DRAM circuit to the memory controller with at least one aspect that is different from that of the plurality of DRAM circuits. In different embodiments, such aspect may include, for example, a number, a signal, a memory capacity, a timing, a latency, a design parameter, a logical interface, a control system, a property, a behavior (e.g. power behavior), and/or any other aspect, for that matter. Such embodiments may, for example, enable higher capacity, full-rank, partial width DIMMs. For the sake of simplicity, the address and control signals on the R-DIMM 900 are not shown in FIG. 9.

Figure 10:
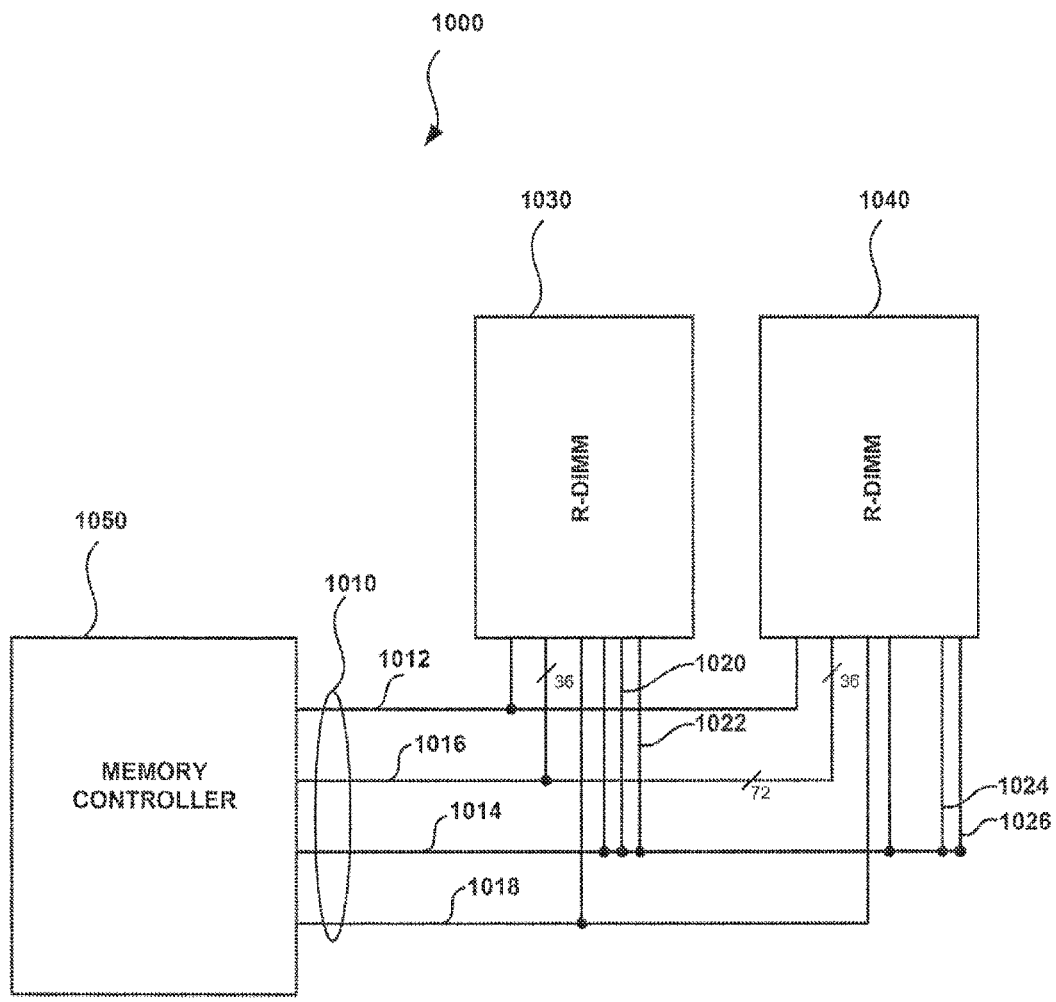
FIG. 10 illustrates an electronic host system that includes a memory controller, and two half width R-DIMMs, in accordance with one embodiment.

FIG. 10 illustrates an electronic host system 1000 that includes a memory controller 1050, and two half width R-DIMMs 1030 and 1040, in accordance with one embodiment. As an option, the electronic host system 1000 may be implemented in the context of the details of FIGS. 1-9. Of course, however, the electronic host system 1000 may be implemented in any desired environment. Additionally, the aforementioned definitions may apply during the present description.

As shown, a parallel memory bus 1010 connects the memory controller 1050 to the two half width R-DIMMs 1030 and 1040, each of which is a two-rank R-DIMM. The memory bus 1010 includes an address bus 1012, a control bus 1014, and a data bus 1016, and clock signals 1018. All the signals in the address bus 1012 connect to both of the R-DIMMs 1030 and 1040 while only half the signals in the data bus 1016 connect to each R-DIMM. The control bus 1014 includes a plurality of chip select signals.

The chip select signals corresponding to the first two ranks, 1020 and 1022, connect to the R-DIMM 1030 while chip select signals corresponding to the third and fourth ranks, 1024 and 1026, connect to the R-DIMM 1040. Thus, when the memory controller 1050 accesses the first rank of DRAM circuits, it asserts chip select signal 1020 and the corresponding DRAM circuits on the R-DIMM 1030 respond to the access.

For example, when the memory controller 1050 performs a read access to the first rank of DRAM circuits, the R-DIMM 1030 provides the entire read data on half the data signals in the data bus but at twice the operating speed of the DRAM circuits on the R-DIMM 1030. In other words, the DRAM circuits on the R-DIMM 1030 that are controlled by chip select signal 1020 will return n 72-bit wide data words at a speed of f transactions per second.

The buffer circuits on the R-DIMM 1030 will transform the read data in 2n 36-bit wide data words and drive them to the memory controller 1050 at a speed of 2f transactions per second. The memory controller 1050 will then convert the 2n 36-bit wide data words coming in at 2f transactions per second back to n 72-bit wide data words at f transactions per second. It should be noted that the remaining 36 data signal lines in the data bus 1016 that are connected to the R-DIMM 1040 are not driven during this read operation.

Similarly, when the memory controller 1050 wishes to access the third rank of DRAM circuits, it asserts chip select signal 1024 and the corresponding DRAM circuits on the R-DIMM 1040 respond to the access such that the R-DIMM 1040 sends back 2n 36-bit wide data words at a speed of 2f transactions per second. In other words, each memory access involves DRAM circuits on only one R-DIMM. Such an arrangement transforms each of the data signals in the data bus 1016 into a point-to-point signal between the memory controller 1050 and one R-DIMM.

It should be noted that full-rank, partial width DIMMs may be compatible with systems that are configured with traditional parallel memory bus topologies. In other words, all the data signals in the data bus 1016 may be connected to the connectors of both of the R-DIMMs 1030 and 1040. However, when full-rank, partial width DIMMs are used each DIMM connects to only half the data signals in the data bus 1016. In such systems, some of the data signals in the data bus 1016 may be point-to-point nets (i.e. without stubs) while other signals in the data bus 1016 may have stubs.

To illustrate, assume that all the signals in data bus 1016 connect to the connectors of the R-DIMM 1030 and the R-DIMM 1040. When two full-rank, half-width R-DIMMs are inserted into these connectors, the data signals in the data bus that are driven by the R-DIMM 1040 are point-to-point nets since the memory controller 1050 and the buffer circuits on the R-DIMM 1040 are located at either ends of the nets. However, the data signals that are driven by the R-DIMM 1030 may have stubs since the buffer circuits on the R-DIMM 1030 are not located at one end of the nets.

The stubs correspond to the segments of the nets between the two connectors. In some embodiments, the data signals in the data bus that are driven by the R-DIMM 1030 may be terminated at the far end of the bus away from the memory controller 1050. These termination resistors may be located on the motherboard, or on the R-DIMM 1040, or in another suitable place. Moreover, the data signals that are driven by the R-DIMM 1040 may also be similarly terminated in other embodiments. Of course, it is also possible to design a system that works exclusively with full-rank, partial width DIMMs, in which case, each data signal in the data bus connects to only one DIMM connector on the memory bus.

While various embodiments have been described above, it should be understood that they have been presented by way of example only, and not limitation. For example, an tin-buffered DIMM (UDIMM), a small outline DIMM (SO-DIMM), a single inline memory module (SIMM), a MiniDIMM, a very low profile (VLP) R-DIMM, etc. may be built to be multi-rank and partial width memory modules. As another example, three-rank one-third width DIMMs may be built. Further, the memory controller and optional buffer functions may be implemented in several ways. As shown here the buffer function is implemented as part of the memory module. The buffer function could also be implemented on the motherboard beside the memory controller, for example. Thus, the breadth and scope of a preferred embodiment should not be limited by any of the above-described exemplary embodiments, but should be defined only in accordance with the following claims and their equivalents.

What is claimed is:

1. A system, comprising:
a memory controller configured to address a number of ranks of memory, the number of ranks being greater than one, each rank having a memory controller rank width;
a memory bus coupled to the memory controller, the memory bus comprising a data bus and a control bus, the data bus having a first number of data signals; and
a plurality of memory modules, wherein
   each memory module is coupled to the memory controller through the memory bus,
   each memory module has the same number of ranks of memory as the memory controller is configured to address, each rank on each memory module having a module rank width that is less than the memory controller rank width,
   each memory module has a number of data pins coupled to the data bus that is equal to the module rank width, the data pins of the plurality of memory modules each being coupled to a different one of the data signals of the data bus, and
   a sum of the module rank widths of the plurality of memory modules is equal to the memory controller rank width.

2. The system of claim 1, wherein each memory module further comprises:
a buffer chip coupled to a corresponding memory circuit of a first rank of the number of ranks and the data bus,
wherein data pins of the corresponding memory circuit of the first rank are connected to a first set of data pins of the buffer chip, and
wherein a subset of the data pins of each memory module are connected to a second set of data pins of the respective buffer chip.

3. The system of claim 2, wherein the buffer chip is further coupled to a corresponding memory circuit of a second rank of the number of ranks,
wherein data pins of the corresponding memory circuit of the second rank are connected to a third set of data pins of the buffer chip, such that a loading of multiple ranks of the memory modules on the data bus appears to the memory controller as a loading of a reduced number of ranks.

4. The system of claim 2, wherein the buffer chip is configured to transform a first data rate associated with memory circuits of the memory modules to a second, different data rate.

5. The system of claim 2, wherein the buffer chip is configured to transform a first data width associated with memory circuits of the memory modules to a second, different data width.

6. The system of claim 2, wherein a number of the first set of data pins of the buffer chip coupled to the corresponding memory circuit of the first memory rank are more than a number of the second set of data pins of the buffer chip coupled to the memory data bus.

7. The system of claim 2, wherein a number of the first set of data pins of the buffer chip coupled to the corresponding memory circuit of the first memory rank are equal to a number of the second set of data pins of the buffer chip coupled to the memory data bus.

8. The system of claim 1, wherein the plurality of memory modules include two memory modules, and wherein the module rank width of each of the two memory modules is half of the memory controller rank width.

9. The system of claim 8, wherein the memory controller is configured to address four ranks of memory.

10. The system of claim 1, wherein the plurality of memory modules include three memory modules, and wherein the module rank width of each of the two memory modules is one third of the memory controller rank width.

11. The system of claim 10, wherein the memory controller is configured to address six ranks of memory.

12. The system of claim 1, wherein the control bus includes a plurality of chip select signals coupled to the memory controller and the plurality of memory modules, and wherein a number of the plurality of chip select signals are equal to the number of ranks of memory that the memory controller is configured to address.

13. The system of claim 12, wherein each memory module further comprises:
a register chip configured to:
   receive a chip select signal of the plurality of chip select signals from the memory controller to access a particular rank of the ranks; and
   assert a corresponding chip select signal to memory circuits of the particular rank.

14. A system, comprising:
a memory controller configured to address a number of ranks of memory, the number of ranks being greater than one, each rank having a memory controller rank width;
a memory bus coupled to the memory controller, the memory bus comprising a data bus and a control bus, the data bus having a first number of data signals; and
two memory modules, wherein
   each memory module is coupled to the memory controller through the memory bus,
   each memory module has the same number of ranks of memory as the memory controller is configured to address, each rank on each memory module having a module rank width that is half of the memory controller rank width,
   each memory module has a number of data pins coupled to the data bus that is equal to the module rank width, the data pins of the two memory modules each being coupled to a different one of the data signals of the data bus, and
   a sum of the module rank widths of the two memory modules is equal to the memory controller rank width.

15. The system of claim 14, wherein each memory module further comprises:
a buffer chip coupled to a corresponding memory circuit of a first rank of the number of ranks, a corresponding memory circuit of a second rank of the number of ranks, and the data bus,
wherein data pins of the corresponding memory circuit of the first rank are connected to a first set of data pins of the buffer chip,
wherein data pins of the corresponding memory circuit of the second rank are connected to a second set of data pins of the buffer chip, and wherein a subset of the data pins of each memory module are connected to a third set of data pins of the respective buffer chip, such that a loading of multiple ranks of the memory modules on the data bus appears to the memory controller as a loading of a reduced number of ranks.

16. The system of claim 15, wherein the buffer chip is configured to transform a first data rate associated with memory circuits of the memory modules to a second, different data rate.

17. The system of claim 15, wherein the buffer chip is configured to transform a first data width associated with memory circuits of the memory modules to a second, different data width.

18. The system of claim 15, wherein a number of the first set of data pins of the buffer chip coupled to the corresponding memory circuit of the first memory rank are more than a number of the third set of data pins of the buffer chip coupled to the memory data bus.

19. The system of claim 15, wherein a number of the first set of data pins of the buffer chip coupled to the corresponding memory circuit of the first memory rank are equal to a number of the third set of data pins of the buffer chip coupled to the memory data bus.

20. The system of claim 14,
wherein the control bus includes a plurality of chip select signals coupled to the memory controller and the two memory modules,
wherein a number of the plurality of chip select signals are equal to the number of ranks of memory that the memory controller is configured to address, and
wherein each of the two memory module further comprises:
   a register chip configured to:
      receive a chip select signal of the plurality of chip select signals from the memory controller to access a particular rank of the ranks; and
      assert a corresponding chip select signal to memory circuits of the particular rank.

\* \* \* \* \*